US006856212B2

(12) United States Patent
Kwiatkowski et al.

(10) Patent No.: US 6,856,212 B2
(45) Date of Patent: Feb. 15, 2005

(54) INCOMPLETE MECHANICAL CONTACTS FOR MICROWAVE SWITCHES

(75) Inventors: Regina Kwiatkowski, Cambridge (CA); Mihai Vladimirescu, Cambridge (CA); Terence J. Menezes, Mississauga (CA)

(73) Assignee: Com Dev Ltd., Cambridge (CA)

( * ) Notice: Subject to any disclaimer, the term of this patent is extended or adjusted under 35 U.S.C. 154(b) by 0 days.

(21) Appl. No.: 10/319,650

(22) Filed: Dec. 16, 2002

(65) Prior Publication Data

US 2004/0113714 A1 Jun. 17, 2004

(51) Int. Cl.[7] ............................ H01P 1/10; H03H 53/00
(52) U.S. Cl. ............................................ 333/105; 335/4
(58) Field of Search ................................ 333/100, 101, 333/105, 262; 335/4, 5; 200/246, 248

(56) References Cited

U.S. PATENT DOCUMENTS

| | | | | |
|---|---|---|---|---|
| 2,850,802 A | | 9/1958 | Breese et al. | |
| 3,088,081 A | | 4/1963 | Concelman | |
| 3,584,173 A | | 6/1971 | Holcomb et al. | |
| 3,671,702 A | | 6/1972 | Penczek | |
| 3,689,854 A | | 9/1972 | Brastow | |
| 3,689,856 A | | 9/1972 | Lambert et al. | |
| 3,719,867 A | | 3/1973 | Ono et al. | |
| 3,786,384 A | | 1/1974 | Jones | |
| 4,317,972 A | | 3/1982 | Kjellberg | |
| 4,330,766 A | | 5/1982 | Pentlicki | |
| 4,618,840 A | | 10/1986 | Yee et al. | |
| 4,851,801 A | | 7/1989 | Engel | |
| 5,063,364 A | | 11/1991 | Tsoi | |
| 5,065,125 A | | 11/1991 | Thomson et al. | |
| 5,075,656 A | | 12/1991 | Sun et al. | |
| 5,281,936 A | | 1/1994 | Ciezarek | |
| 5,451,918 A | | 9/1995 | Sun | |
| 5,499,006 A | | 3/1996 | Engel et al. | |
| 5,652,558 A | | 7/1997 | Leikus et al. | |
| 5,735,392 A | | 4/1998 | Shirasaka | |
| 5,883,556 A | | 3/1999 | Shutes | |
| 5,936,482 A | | 8/1999 | Ando et al. | |
| 6,037,849 A | | 3/2000 | Ciezarek | |
| 6,043,440 A | * | 3/2000 | Sun et al. | 200/51.04 |
| 6,191,375 B1 | * | 2/2001 | Cardona et al. | 200/248 |
| 6,211,756 B1 | * | 4/2001 | Sun et al. | 335/4 |
| 6,307,169 B1 | | 10/2001 | Sun et al. | |

OTHER PUBLICATIONS

Deeg, E.W., New Algorithms for Calculating Hertzian Stresses, Deformations and Contact Zone Parameters, AMP Journal of Technology, vol. 2, Nov. 1992, pp. 14–24.

Ellis, J. P., Design of Reliable Multiple Contact for Coin Telephone Totalizer, Proc., Holm Seminar on Electric Contact Phenomena, Illinois Institute of Technology, 1969, pp. 29–41.

Greenwood, J. A. Constriction Resistance and the Real Area of Contact, Brit. J. Appl. Phys., 1966, vol. 17, pp. 1621–1632.

Holm, R., Electric Contacts, Theory and Application, Fourth Edition, Berlin, Springer–Verlag, 1981, pp. 9–26.

Johnson, K. L, Contact Mechanics, Cambridge University Press, 1985, pp. 35–40, 90–95.

(List continued on next page.)

*Primary Examiner*—Robert Pascal
*Assistant Examiner*—Dean Takaoka
(74) *Attorney, Agent, or Firm*—Bereskin & Parr

(57) ABSTRACT

A switch contact for use in a microwave switch. The contact comprises a probe contact member having a first contact region with a first surface, and a reed contact member having a second contact region with a second surface. The second surface is non-conformal with respect to the first surface for providing an incomplete mechanical contact when the contact members are in contact.

23 Claims, 9 Drawing Sheets

OTHER PUBLICATIONS

Minowa, I., Nakamura, M., Kanno, M., Conductance of Contact Interface depending on Location and Distribution of Conducting Spots, Proc. Electrical Conference on Contacts, Electromechanical Components and Their Applications, 1988, pp. 21–28.

Nakamura, M., Minowa, I., Computer Simulation for the Conductance of a Contact Interface, IEEE Transactions on Components, Hybrids, and Manufacturing Technology, vol. CHMT–9, 150–155, No. 2, Jun. 1986.

Nishiyama, H., Minowa, I., A Study of the Approximate Expression for Construction Resistance of Multitude Conducting Spots, IECE Trans. Electron. vol. EB2–C, No. 1, Jan 1999, pp. 25–32.

Pitney, Kenneth E., Ney Contact Manual, Electrical Contacts for Low Energy Uses, The J.M. Ney Compaany, 1973, pp. 1–3, 6–7, 148–149.

Shigley, J. E., Mischke, C. R., Standard Handbook Machine Design, second edition, McGraw–Hill, New York, Sydney, Tokyo, Toronto, 1996, pp. 49. 17–49.22.

Slade, Paul G., Electrical Contacs, Principle and Applications, New York, Basel, Marcel Dekker, Inc., 1999, pp. 4–15.

Tangena, A. G., Hurkx, G. A. M., Calculations of Mechanical Stresses in Electrical Contact Situations, IEEE Trans. on Components, Hybrids, and Manufacturing Technology, vol. CHMT–8, No.1, Mod. 1985, pp. 13–20.

Wadell, Brian C., Transmission Line Design Handbook, Artech House, Inc., 1991, p. 36.

* cited by examiner

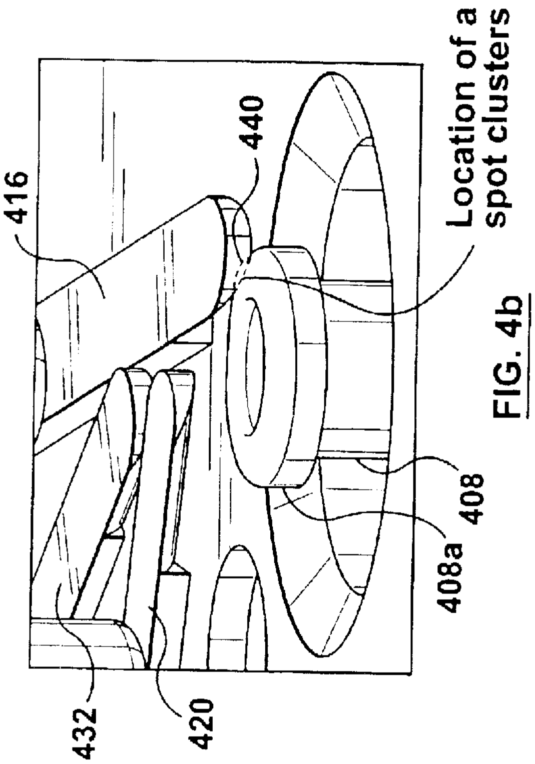
FIG. 4b
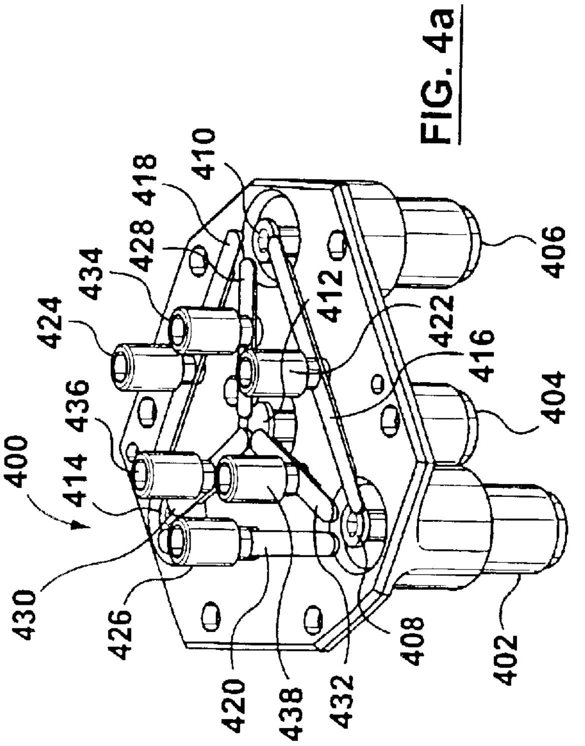
FIG. 4a
FIG. 4c
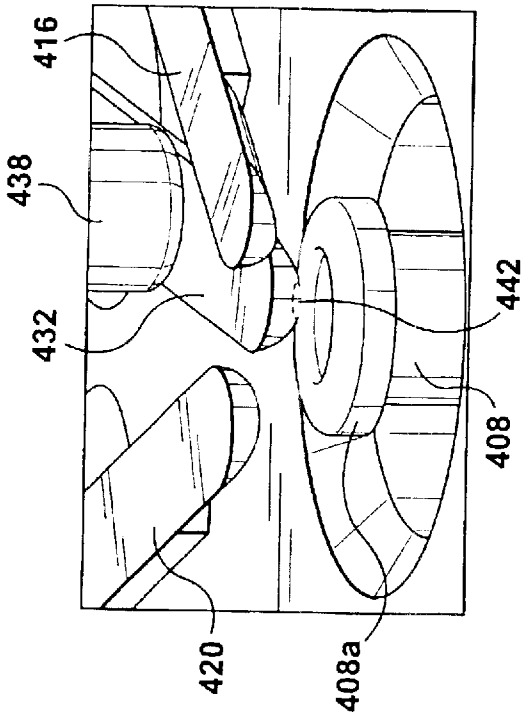

INCOMPLETE MECHANICAL CONTACTS FOR MICROWAVE SWITCHES

FIELD OF THE INVENTION

The invention relates to structural features for the contact members of a switch contact. In particular, the invention provides structural features for the contact members of a microwave switch contact that facilitate an incomplete mechanical contact with a reduced stress distribution when the contact members are in contact with one another.

BACKGROUND OF THE INVENTION

Microwave switches are often used in satellite communication systems where performance, reliability and lifetime of system components are important. These parameters relate to the contact resistance of a microwave switch. In particular, microwave switches require low DC contact resistance, low insertion loss (i.e. the attenuation between the input and output ports of an activated path) and low impedance mismatch for good RF performance. Heat dissipation and insertion loss due to conductor and reflection losses increase for microwave switches with increased contact resistance. Furthermore, the life of a microwave switch is expressed as the number of actuation cycles for which the contact resistance does not deteriorate above a certain limit.

A microwave switch contact involves the physical engagement or contact of a first contact member by a second contact member. As it is known to those skilled in the art, the first contact member is a fixed contact also known as a probe and the second contact member is a moveable contact also known as a reed. The contact resistance and the life of the microwave switch are determined by the regions of the reed and probe that come into contact with each other (hereafter referred to as contact regions). The contact interface is herein defined as the surface of the contact members that are in physical contact with one another. To reduce ohmic losses, each contact member is typically plated with a conductive material having a high electrical conductivity like a metal such as gold.

Most prior art microwave switches have probes and reeds with contact regions that are flat surfaces. However, it is not preferable to use flat surfaces for both contact regions since there is a high degree of stress at the edges of flat contact regions. This stress may result in the excessive plastic deformation of at least one of the contact regions in which the yield strength of the material is exceeded. This in turn increases the contact resistance and decreases the lifetime of the switch contact members.

In order to address these issues, contact theory and the electrical junction between the probe and reed contact regions must be examined. The electrical junction comprises a plurality of spots, known in the industry as a-spots, that provide a multitude of parallel, microscopic electrical and mechanical connections between the probe and the reed contact region. The number and shape of the a-spots depend on the surface roughness of the contact regions and the contact pressure. The a-spots are located in clusters having a position and a diameter that is determined by the radii of the contact regions, the material properties (i.e. modulus of elasticity and Poisson ratio), large-scale waviness of the surface of each contact region and the contact pressure distribution. The contact pressure distribution is the distribution of the contact force on the contact interface. Although mechanical contact occurs at many a-spots, electrically conductive a-spots do not occur at surface insulating layers such as oxide films. Accordingly, the total contact resistance is a summation of bulk resistance, constriction resistance (i.e. the resistance of the a-spots) and film resistance (due to surface films and other non-conducting contaminants in the contact interface) (P. G. Slade (1999), *Electrical Contacts: Principle and Applications*, pp 4–15).

Research has shown that for contact surfaces having an anisotropic micro-topography, the a-spot distribution has an elliptical shape with a spreading resistance that is given by:

$$R_s(a, b) = \frac{\rho}{4 \cdot a_c} \cdot f\left(\sqrt{\frac{a}{b}}\right) \tag{1}$$

where a and b represent the semi-axes of an elliptical a-spot, ac is the radius of a circular a-spot having an area identical to that of the elliptical a-spot and the function f is a form factor related to experimental data. The form factor decreases from one to zero as the aspect ratio (a/b) increases from one towards infinity (P. G. Slade, *Electrical Contacts: Principles and Applications*, New York, Marcel Dekker, Inc., pp. 4–15, @1999). The spreading resistance is half of the contact resistance in the absence of insulating films between the reed and probe contact regions.

Contact theory describes three different types of contact interaction from a mechanical point of view: incomplete mechanical contacts, complete mechanical contacts and receding mechanical contacts (K. L. Johnson, *Contact Mechanics*, Cambridge University Press, @ 1985). Incomplete mechanical contacts comprise non-conformal contact members (i.e. contact members which do not have identical contact regions). When the contact members are pressed together, the area of the contact interface increases in size as the applied contact force increases. The initial contact is made at a point or a line, which then increases into a curvilinear region as the applied contact force increases. The contact pressure approaches zero at the edges of the contact interface. Consequently, the a-spot clusters are located towards the center of the contact interface and the contact resistance is independent of the distribution of the a-spots (J. A. Greenwood, "Constriction Resistance and the Real Area of Contact", Brit. J. Appl. Phys., 3,277,1970; M. Nakamura et al., "Computer Simulation for the conductance of a contact interface", IEEE Trans. Comp. Hybrids Manuf. Technol., CHMT-9, p. 150, 1986; I. Minowa et al., "Conductance of Contact Interface depending on Location and Distribution of Conducting Spots", Proc. Electrical Conference on Contacts, Electromechanical Components and Their Applications, p. 19, 1986). This is beneficial for having a consistent contact resistance that is fairly stable during a plurality of contact actuations. This is also beneficial for manufacturing batches of probes and reeds which all have a relatively similar contact resistance that is predictable. Furthermore, for contact members with non-conformal contact surfaces, Hertz theory predicts that the maximum of the contact stress occurs at a certain depth from the surface of the contact interface.

Complete mechanical contacts comprise contact members having conformal surface geometries (K. L. Johnson, *Contact Mechanics*, Cambridge University Press, @ 1985). Consequently, the contact pressure has a singularity (i.e. the stress magnitude is extremely high) at the edges of the contact interface. This may lead to excessive plastic deformation in the regions of the contact members situated in the vicinity of the edges, which reduces the lifetime of the switch. Furthermore, in a complete contact, the a-spots are distributed close to the periphery of the contact interface.

Consequently, contact resistance is no longer independent of the distribution of the a-spots. Accordingly, the contact resistance may vary across consecutive contact actuations and is sensitive to manufacturing variability. This results in a degradation of the RF performance of the microwave switch.

Receding mechanical contacts comprise contact members having surface geometries that, when pressed together, result in a contact interface having an area that decreases when the applied contact force increases (Hill, *Mechanics of Elastic Contacts*, Butterworths-Heinemann Ltd., @ 1993). A receding contact is specific to thin membrane contacts having a low stiffness. Receding mechanical contacts are usually not applicable to microwave switches due to their low stiffness.

Prior art attempts to address the issue of contact resistance involve using probes and reeds that have conformal contact regions (such as two flat surfaces). Unfortunately, contact members with conformal contact regions behave as complete mechanical contacts. This is disadvantageous for the reasons specified above. Furthermore, this structure for the reed and probe contact regions does not allow for controlled wiping. Wiping involves cleaning the surface of the probe and reed contact regions from minor films and brushing aside particulate contamination. This is beneficial since minor films and non-conducting particles on the contact interface increase contact resistance. Accordingly, wiping will reduce contact resistance and improve contact performance (K. E. Pitney, NEY Contact Manual: Electrical Contacts for Low-Energy Uses, The J. M. NEY Company, @ 1973).

Another prior art method to improve contact resistance involves using texture features for the contact region. It is well known to those skilled in the art that a very low and consistent contact resistance may be obtained by imposing a surface texture having a roughness on the surface of the harder plated layer of the probe, for example. The roughness has a certain lay, which provides for elliptical a-spots when the contact regions of the probe and the reed are in contact with one another. In this case, there is a reduction in contact resistance because the a-spots have an elliptical shape with a high aspect ratio (i.e. the semi-axis length b is much larger than the semi-axis length and contact resistance decreases due to the effect in Equation 1). Furthermore, the contact interface area is larger since the softer plated layer on the reed (usually) contact region deforms around the asperities (i.e. microscopic surface peaks) of the harder plated layer on the probe contact region. In addition, an optimal surface texture may locate the a-spot clusters near the center of the apparent contact area. However, it is difficult to repeatably manufacture the surface texture on the probe since the surface texture and the lay direction are difficult to specify and measure. Accordingly, the contact resistance varies across different manufactured batches of switches. Furthermore, the contact regions of the probe and the reed form a complete mechanical contact, which results in a reduction in the life of the switch for the reasons specified above.

SUMMARY OF THE INVENTION

The present invention is directed to surface features of the contact regions of reeds and probes to provide a switch contact having an improved contact resistance, thereby providing increased reliability and longer lifetime. The surface features described herein are applicable to a wide range of microwave switches such as, but not limited to, S-switches, C-switches, T-switches, SPnT switches and R-switches. The surface features result in contact members, which have non-conformal contacts thereby providing an incomplete mechanical contact. These non-conforming contacts may include the combination of a flat surface contact with a convex surface contact or of two contact convex surfaces. Regardless of the combination of non-conforming contact regions, the contact region which has a curved surface with a radius of curvature that is determined by the material properties of the contact members, the magnitude of the contact forces and the dimensional limitations of the contact regions imposed by the RF requirements. This radius of curvature is determined such that there is a reduction in the contact stress distribution within the contact members. Preferably, the maximum contact stress occurs within the metallic substrate region of at least one of the probe and reed contact members so that excessive plastic deformation of the contact members does not occur. This includes reducing the stress in the plated layer of the contact members.

In addition, the various embodiments of the non-conforming contact members are robust to misalignments and provide a good controlled wiping action. Furthermore, the non-conformal surfaces used for the contacts do not result in large manufacturing variations since the required surfaces are surfaces of revolution that are easily generated.

In a first aspect, the present invention provides a switch contact for use in a microwave switch. The switch contact comprises a probe contact member having a first surface, and a reed contact member having a second surface. The second surface is non-conformal with respect to the first surface for providing an incomplete mechanical contact. During contact, a contact stress distribution exists having a maximum stress value at a location within the contact members. At least one of the surfaces has a radius of curvature selected to adjust the location of the maximum stress value for reducing the magnitude of the contact stress distribution within the contact members.

Preferably, the microwave switch comprises an RF module, an actuation module in communication with the RF module, and a control module in communication with the actuation module. The RF module has a plurality of the probe contact members and a plurality of the reed contact members. Each of the reed contact members has a transmitting state to electrically connect a pair of the probe contact members, and a non-transmitting state to electrically isolate the pair of probe contact members, thereby defining a switch configuration for the microwave switch. The actuation module has an actuator for moving at least one of the reed contact members into a transmitting state and moving the remainder of the reed contact members into a non-transmitting state. The control module receives command signals to control the switch configuration by providing signals to the actuation module.

In another aspect, the present invention provides a switch contact for use in a microwave switch. The switch contact comprises a probe contact member having a first surface, and a reed contact member having a plurality of fingers each having a second surface. The first and second surfaces are non-conformal. During contact, the first and second surfaces provide an incomplete mechanical contact and the plurality of fingers provide a plurality of contact regions for reducing contact resistance.

In another aspect, the present invention provides a switch contact for use in a microwave switch. The switch contact comprises a probe contact member having a first surface and a reed contact member having a second surface with a radius of curvature. The second surface is non-conformal with respect to the first surface for providing an incomplete mechanical contact when the contact members are in contact.

In another aspect, the present invention provides a switch contact for use in a microwave switch. The switch contact comprises a probe contact member having a first surface with a toroidal shape, and a reed contact member having a second surface. During contact, the first and second surfaces define a non-conformal contact having a contact interface located along a circular arc on a curved portion of the toroidal shape.

In another aspect, the invention provides a method of reducing stress distribution in a switch contact for a microwave switch, the switch contact comprising a probe contact member having a first surface, and a reed contact member having a second surface. The method comprises:

a) selecting the first and second surfaces to be non-conformal for providing an incomplete mechanical contact, at least one of the surfaces having a radius of curvature;
b) calculating contact stress distributions within the contact members for several values of the radius of curvature; and,
c) selecting a desired radius of curvature from the several values of the radius of curvature for reducing the contact stress distribution within the contact members.

BRIEF DESCRIPTION OF THE DRAWINGS

For a better understanding of the invention and to show more clearly how it may be carried into effect, reference will now be made, by way of example only, to the accompanying drawings which show preferred embodiments of the invention and in which:

FIG. 4*a* is a partial view of an RF module having another alternative embodiment of probes and reeds with non-conformal contact regions in accordance with the present invention;

FIG. 4*b* is a magnified view of the reeds and probes of FIG. 4*a* showing a contact made between a long reed and a probe;

FIG. 4*c* is a magnified view of the reeds and probes of FIG. 4*a* showing a contact made between a short reed and a probe;

DETAILED DESCRIPTION OF THE INVENTION

There are a variety of microwave switch structures such as SPDT-switches, C-switches, SPnT switches, S-switches, T-switches and R-switches. An SPDT-switch has three probes (one input probe and two output probes) and two conductor paths. A C-switch has four probes (two input probes and two output probes) and four conductor paths. A T-switch has four probes (two input probes and two output probes) and six conductor paths. An R-switch is very similar to a T-switch and has four probes (two input and two output probes) and five conductor paths. A number of switch-configurations are known for these microwave switches, most of which have their own specific type of actuating mechanisms. However, each microwave switch has certain basic components. The present invention is applicable to each of these types of microwave switches.

Figure 1A:
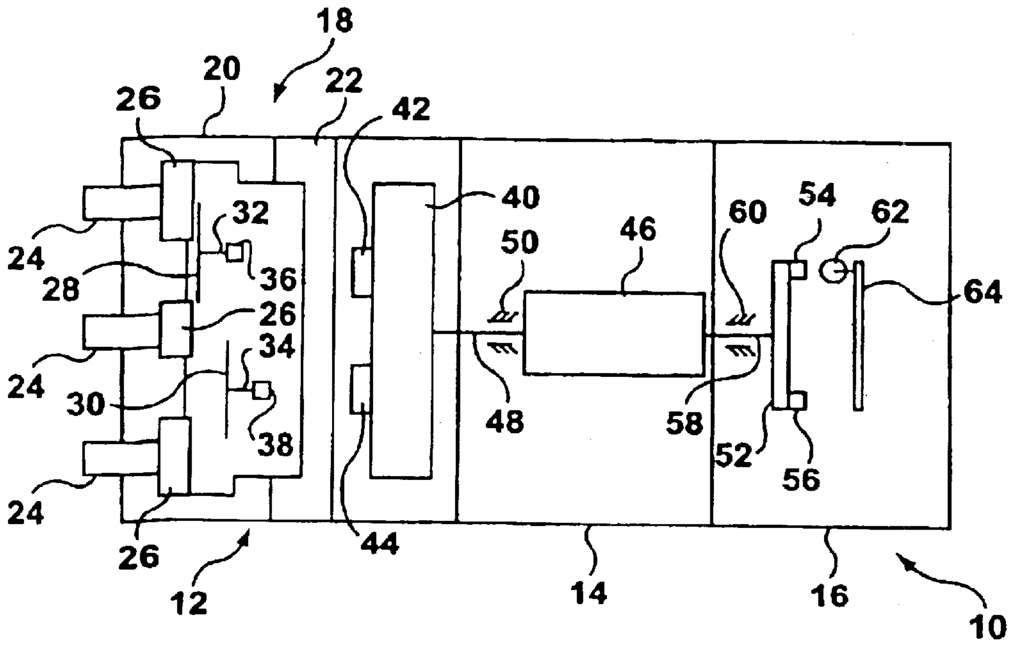
FIG. 1a (Prior Art)
FIG. 1*a* is a block diagram of the components of a typical prior art microwave switch.

Referring now to FIG. 1*a*, shown therein is a block diagram illustrating the typical components of a microwave switch 10. This is but one embodiment of the microwave switch 10 shown for exemplary purposes and is not meant to limit the invention. The microwave switch 10 may be a single-pole double-throw switch or a partial view of a double-pole double-throw C-switch or a T-switch. The microwave switch 10 generally comprises an RF module 12, an actuator module 14 and a control module 16. The RF module 12 has a housing 18 that comprises an RF head 20 and an RF cover 22 (see FIGS. 1*b*, 1*c* and 1*d* for an exemplary embodiment). The RF head 12 comprises RF connectors 24 each having a probe 26. The connectors 24 provide a connection between the microwave switch 10 and the coaxial transmission lines (not shown). The RF head 20 further comprises reeds 28 and 30 each having a dielectric pin 32 and 34 that houses a permanent magnet 36 and 38. The permanent magnets 36 and 38 in general do not have to be of the same polarity. Underneath the RF cover 22 rotates a disk 40 having permanent magnets 42 and 44. The permanent magnets 42 and 44 in general do not have to be of the same polarity. However, the combination of the permanent magnets 36, 38, 42 and 44 have to be such that when, for example, the pair of magnets 36 and 42 and 38 and 42 will attract, while the pair of magnets 36 and 44 and 38 and 44 will repel or reverse. Accordingly, by rotating the disk 40, one of the reeds 28 or 30 will contact two of the probes 24 and the other reed 28 or 30 will not contact the probes 24.

The actuator module 14 comprises a drive mechanism or actuator 46 that controls the rotation of the disk 40 so that one of the reeds 28 and 30 contacts two of the probes 24. In the example shown in FIG. 1*a*, the actuator 46 may be a stepper motor such as a rotary permanent magnet stepper motor or a rotary variable reluctance stepper motor. The stepper motor is connected to the disk 40 via a drive shaft 48 along with an appropriate bushing or ball bearing 50. Alternatively, a mechanical camshaft may be used.

The control module 16 has an electrical interface with a printed circuit board comprising feed through pins that provide DC command signals to the actuator module 14. In particular, the DC command signals are sent to the windings of the stepper motor in the actuator module 14 to excite one of the windings to place the microwave switch 10 in a desired switch configuration. The DC command signals comprise pulses having a certain duration and polarity. Both positive and negative DC command signals may be used. The control module 16 further comprises a telemetry interface that comprises appropriate electronics to provide an indication of the configuration of the microwave switch 10. In this example, the control module 16 comprises a telemetry arm 52 having telemetry magnets 54 and 56. The telemetry arm 52 is connected to the actuator 46 via a second drive shaft 58 with a second appropriate bushing or ball bearing 60. The telemetry arm 52 rotates together with the disk 40. The orientation of the magnets 54 and 56 provide an indication of the configuration of the microwave switch 10 by interacting with various telemetry reeds one of which is indicated at 62. Thus for each of the microwave switch 10 positions, a unique reed switch configuration exists in the control module 16. More details about the operation of the microwave switch 10 are provided in U.S. Pat. Nos. 5,065,125 and 5,499,006.

Figure 1B:
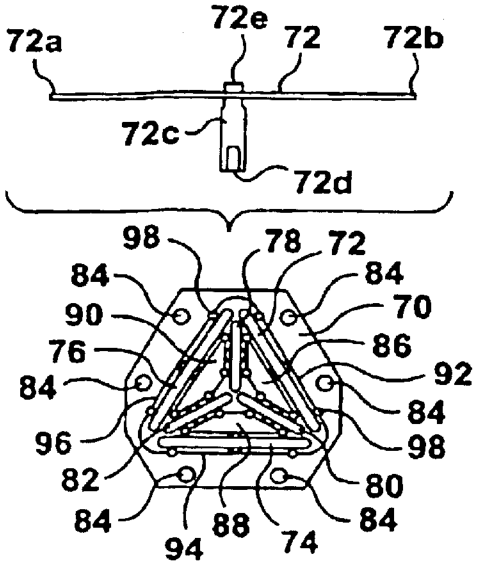
FIG. 1b (Prior Art)
FIG. 1*b* is a diagram of an RF cover for a prior art RF module.

Referring now to FIG. 1*b*, shown therein is a top view of an RF cover 70 in accordance with an exemplary embodiment of a prior art T switch having three long reeds 72, 74 and 76 as well as three short reeds 78, 80 and 82. The RF cover 70 is preferably made from aluminum. Using reed 72 as an example, each reed has a first end 72*a* and a second end 72*b* which each have a contact region on an upper surface thereof. Each reed is connected to a pin 72*c* having an internal bore 72*d* that houses a permanent magnet (not shown). The pin 72*c* is inserted through a hole (not shown) in the reed 72 and is secured to the reed 72 via a fastener 72*e*. The reeds 72, 74, 76, 78, 80 and 82 are separated into three sets to define three unique RF switching configurations (see FIG. 1*e*). The RF cover 70 has several apertures 84 for allowing connection to a corresponding actuator module.

The RF cover 70 further comprises central walls 86, 88 and 90 and outer walls 92, 94 and 96, which are oriented to provide a plurality of waveguide channels within the RF cover 70. There are six waveguide channels with the RF cover 70 which have three ground planes comprising two side ground planes provided by two of the walls 86, 88, 90, 92, 94 and 96 and an upper ground plane provided by the underside of the RF cover 70 within each of the waveguide channels. A coaxial transmission line path is created between a pair of probes (not shown) when the probes are connected by an appropriate reed 72, 74, 76, 78, 80 or 82. The RF cover 70 further comprises a plurality of guide pins 98 (two of which are labeled for simplicity). The guide pins 98 are made of a dielectric material and are used to insure that the reeds 72, 74, 76, 78, 80 and 82 move in a linear fashion when actuated. The guide pins 98 further insure that the reeds 72, 74, 76, 78, 80 and 82 do not contact the walls 86, 88, 90, 92, 94 and 96 during actuation. The guide-pins 98 may be of Ultem®, or some other dielectric material. The RF cover 70 is made from Aluminum and is preferably plated to reduce wear from possible impacts from the reeds 72, 74, 76, 78, 80 and 82.

Figure 1C:
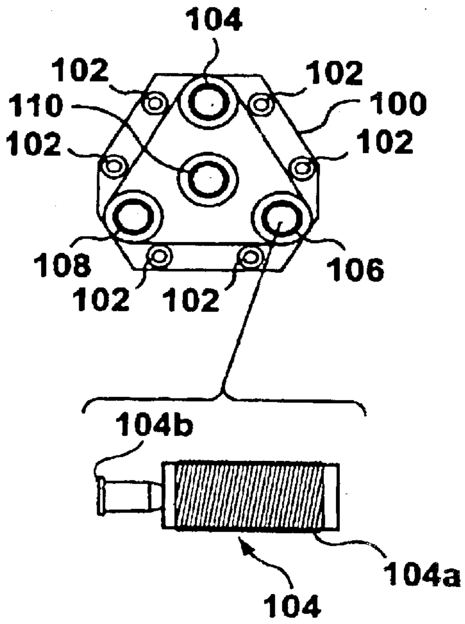
FIG. 1c (Prior Art)
FIG. 1*c* is a diagram of a corresponding prior art RF head for the RF cover of FIG. 1*b;*

Referring now to FIG. 1*c*, shown therein is a bottom view of a RF head 100 which is preferably made from aluminum and is configured to engage the RF cover 70. Accordingly, the RF head 100 comprises a plurality of fasteners 102 which protrude through the apertures 84 in the RF cover 70 to attach the RF head 100 and the RF cover 70 to a corresponding actuator module 14.

The RF head 100 further comprises four probe connector assemblies 104, 106, 108 and 110 which are mounted within the RF head 100. Using probe connector assembly 104 as an example, each probe connector assembly 104 has a connector shell 104*a* for mechanically engaging a coaxial cable (not shown) and a probe contact region 104*b* that is connected to the inner conductor of the coaxial cable. The outer conductor of the coaxial cable is connected to RF head 100 through the connector shell 104*a* of the probe connector assembly 104. Several types of connectors may be used for the connector assembly 104 such as but not limited to, an SMA connector, a TNC connector and an N connector. The particular type of connector used depends on the amount of power that is delivered to the microwave switch. The probe contact region 104*b* is physically engaged by a reed contact region when a reed is moved towards the probe 104 to make contact therewith. The probe 104 is mounted within the RF head 100 such that the connector shell 104*a* is located on the outside of the RF head 100 and the probe contact region 104*b* is located in the interior of the RF head 100.

Figure 1D:
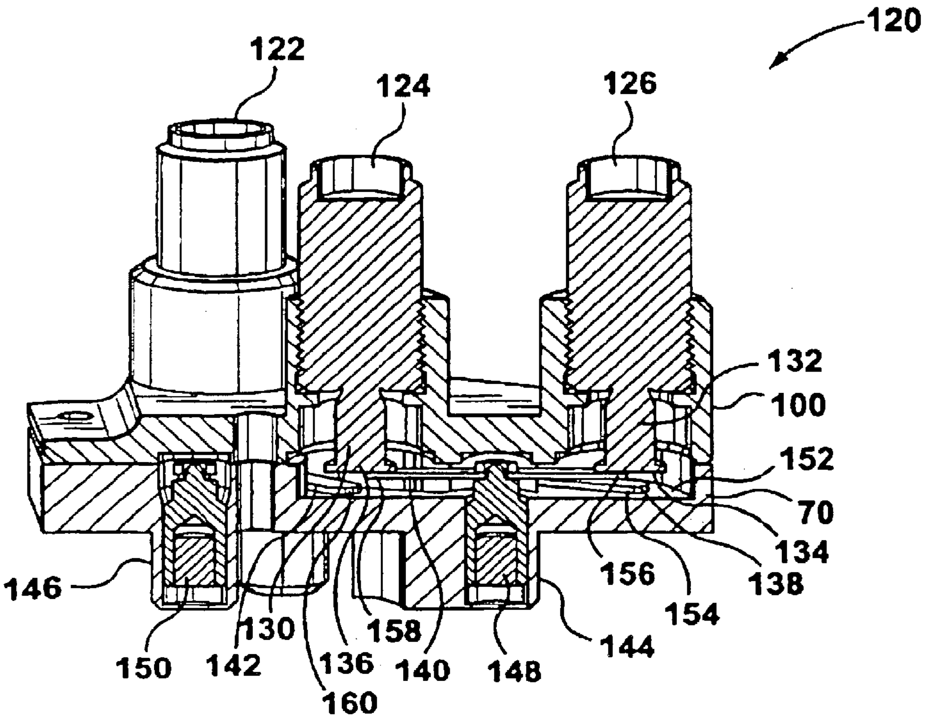
FIG. 1d (Prior Art)
FIG. 1*d* is a partial sectional view of the prior art RF cover of FIG. 1*b* attached to the prior art RF head of FIG. 1*c;*

Referring now to FIG. 1*d*, shown therein is a partial cross-sectional view of an RF module 120 that comprises the RF cover 70 and the RF head 100. Connectors 122, 124, 126, and 128 (not shown) protrude from the bottom of the RF head 100. Two probes 130 and 132 are shown which correspond to the connectors 124 and 126 respectively. The probes 130 and 132 each have a probe contact region 134 and 136 respectively. Also shown are reeds 138, 140 and 142 and two pins 144 and 146 each having a magnet 148 and 150. Also shown is an RF cavity 152 that extends throughout the interior of the RF cover 70 and the RF head 100 and is comprised of the waveguide channels formed between the central walls and the outer walls shown in FIG. 1*b*. Since the coupling between the reed/pin assemblies and the actuator (see FIG. 1*a*) is magnetic, the RF module 120 was designed as a self contained, "sealed" unit to reduces the leakage of electromagnetic fields.

Figure 1E:
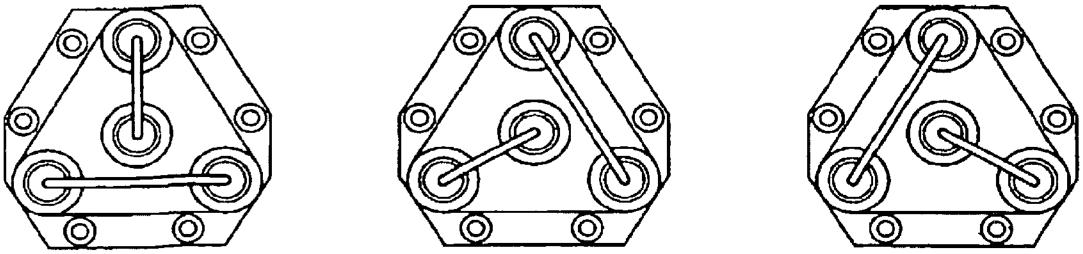
FIG. 1e (Prior Art)
FIG. 1*e* shows the probe and reed contact configurations during the operation of a prior art T-switch.

During T-switch operation, two of the reeds in the RF cover 70 are moved towards the probes to create two continuous coaxial transmission line paths (the various configurations of the contacting reeds and probes during the operation of a T-switch are shown in FIG. 1*e*). The transmission line path geometry of the RF channel is designed to provide an RF coaxial line with characteristic impedance $Z_0$ (typically 50 ohms). This provides an impedance match with the impedance of the coaxial transmission lines that are connected to the connectors. The other four reeds are kept adjacent to the upper ground plane in the interior of the RF cover 70. In FIG. 1*d*, reeds 138 and 142 are shown in a non-transmission state. The geometry of a waveguide is designed so that the cutoff frequency is higher than the operating frequency of the microwave switch. Accordingly, there is a high level of isolation between the probes that are associated with a non-transmitting waveguide path.

It is well known to those skilled in the art that the probes and reeds of microwave switches are plated with pure gold or gold alloys. Referring to FIG. 1*d*, the contact regions of the probes and reeds of prior art microwave switches have flat surfaces as shown at contact regions 154, 156, 158 and 160. Accordingly when the contact region 156 of the reed 140 physically contacts the contact region 154 of the probe 132, a complete mechanical contact is formed. This results in increased values of stress occurring at the edges of the contact interface, which may lead to excessive plastic deformation of the contact regions. Consequently, the lifetime of the microwave switch is reduced and contact resistance varies between successive actuation.

It is desirable for the RF module 120 to have good RF performance. Accordingly, the contact regions in the RF module 120 are preferably designed to have low ohmic losses, good heat transfer properties and the ability to handle mechanical loads. To achieve these goals, it is well known in the art to construct the contact regions from a structural material or substrate that is capable of withstanding the required mechanical loads and can provide good heat transfer properties such as copper or a copper alloy such as beryllium copper. The substrate is then plated with a thin layer of very low resistivity material, which does not erode or corrode easily such as pure gold or a gold alloy. This is possible because at microwave frequencies, current flow in metals is essentially a surface phenomenon in which the entire current flow takes place in a thin surface layer having a thickness of approximately three skin depths (the skin depth is related to the frequency of the current and the relative permeability and electrical conductivity of the material used for the plating layer). Gold also has a high resistance to surface film formation. However, gold and gold alloys are characterized by reduced mechanical properties like tensile strength, yield strength, hardness etc in comparison to the substrate material.

During the operation of the microwave switch 10, a contact stress distribution exists in the plating layers and the metallic substrates of the contact members. The magnitude of the stress distribution is such that the plating layers undergo a degree of plastic deformation. Unfortunately, in the prior art, care was not taken to reduce the magnitude of the stress distribution and in many cases the resulting degree of plastic deformation was excessive to the point of producing excessive wear and tear on the contact members. This in turn results in increased contact resistance and decreased reliability and lifetime of the switch contact.

Figure 2B:
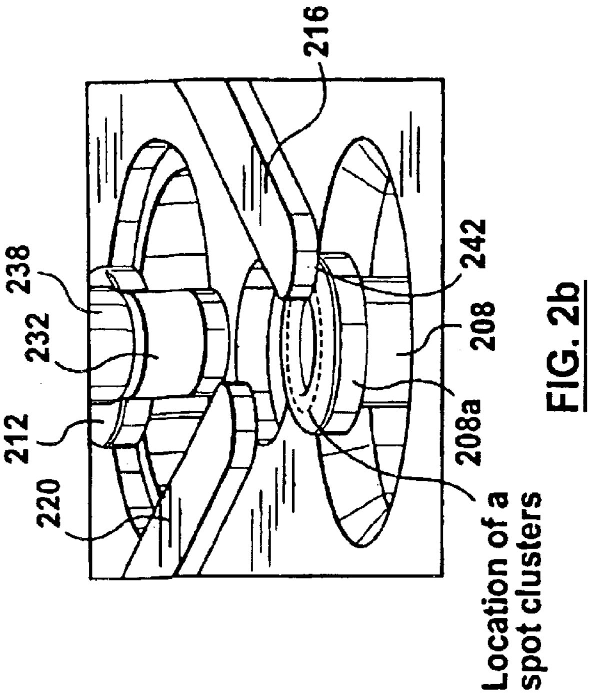
FIG. 2*b* is a magnified view of the reeds and probes of FIG. 2*a* showing a contact made between a long reed and a probe.
Figure 2D:
FIG. 2*d* shows a curvilinear contact interface formed during the initial contact of a reed and probe shown in FIGS. 2*a* to 2*c;*
Figure 2E:
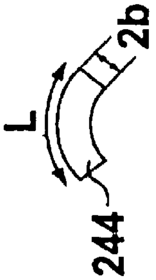
FIG. 2*e* shows a curvilinear rectangular contact interface formed when there is an increased contact force between a reed and probe shown in FIGS. 2*a* to 2*c;*
Figure 2A:
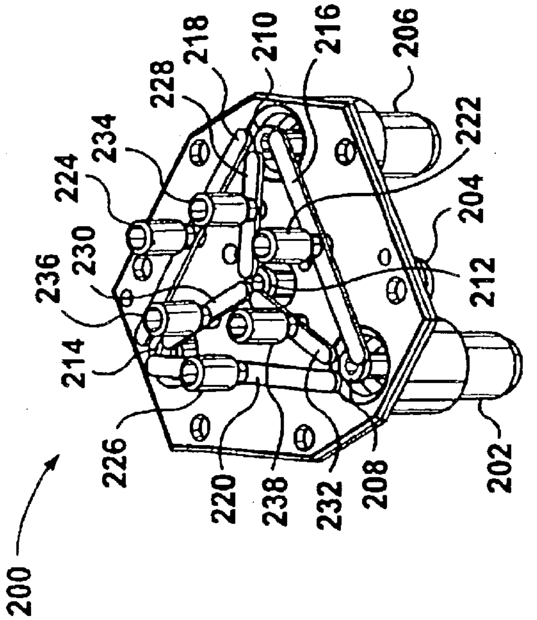
FIG. 2*a* is a partial view of an RF module having probes and reeds with non-conformal contact regions in accordance with the present invention.

Referring to FIG. 2*a*, shown therein is a partial view of an RF module 200 for a T-switch in which the RF cover, dielectric pins and internal walls have been removed. The RF module 200 has connectors (of which only three are shown) 202, 204 and 206 and four probes 208, 210, 212 and 214 each having toroidal contact regions. Also shown in FIG. 2*a* are three long reeds 216, 218 and 220 each having pins 222, 224 and 226 respectively as well as three short reeds 228, 230 and 232 each having pins 234, 236 and 238 respectively. Each reed has flat contact regions.

The reed and probe contact regions shown in FIG. 2*a* have non-conformal surfaces thus providing for an incomplete mechanical contact when a reed contacts a probe. The contact may be described as a cylindrical contact region making contact with a flat contact region. In particular, the toroidal surface of the probe contact region 208*a* (see FIGS. 2*b* and 2*c*) has a radius of curvature that is determined by the material properties of the contact regions, the magnitude of the contact forces, and the dimensional limitations imposed by the RF requirements of the microwave switch. Since contact regions of the reeds and the probes of FIG. 2*a* form incomplete mechanical contacts, a number of advantages are provided such as the formation of contacts having a contact resistance that is independent of the a-spot distribution. This results in a fairly stable contact resistance across many contact actuations. Furthermore, the contact pressure distribution approaches zero at the edges of the contact interface with the maximum amount of stress occurring at a certain depth underneath the surface of the probe contact interface. The radius of curvature is also selected to vary the location of the maximum contact stress which reduces the magnitude of the contact stress distribution within the contact members as discussed further below.

Referring now to FIG. 2*b*, shown therein is a contact in which the first contact member is the reed 216 and the second contact member is the probe 208. In particular, the contact region of the reed 216 comprising a flat surface 240 has contacted the contact region of the probe 208 comprising a portion of the toroidal surface 208*a* to form a line contact interface 242. The other two reeds 220 and 232 do not make contact with the probe 208 since only one reed may contact a probe at a time in this example. The contact interface begins as a curved line 242 (see FIG. 2*d*) along which the a-spot clusters are located which then turns into a curvilinear region 244 (see FIG. 2*e*), which appears as a portion of an annulus. As can be seen, the probe 208 and the reeds 216, 220 and 232 are configured so that there is enough room for more than one reed 216, 220 and 232 to contact the probe 208 although only one reed 216, 220 and 232 may contact the probe 208 at a time in this example.

In addition, the contact interface occurs along an arc on a curved portion of the toroidal surface 208*a* of the probe 208 so that the reed 232 contacts the outer curved surface of the toroidal surface 208*a*. This has advantages such as providing a greater degree of wiping as explained further below. Those skilled in the art will also realize that the contact made is a "frontal" contact rather than a "side" contact which is beneficial since a "side" contact results in increased stray capacitance. These observations also hold for other embodiments discussed below.

Figure 2C:
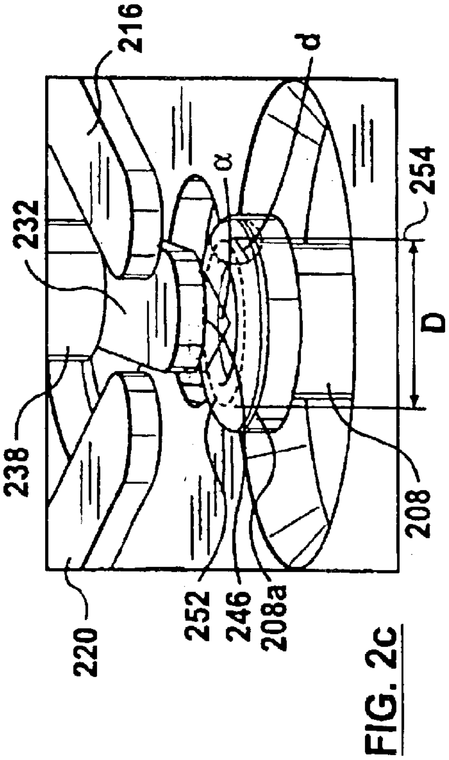
FIG. 2*c* is a magnified view of the reeds and probes of FIG. 2*a* showing a contact made between a short reed and a probe.

Referring now to FIG. 2*c*, a contact interface 246 is now formed comprising the surface of the flat contact region of the reed 232 and the surface of the toroidal contact region of the probe 208. Once again, the contact interface begins as a curved line 242 along which the a-spot clusters are located. The curved line 242 is an arc of a circle 252 of a cylinder 254. The curved line 242, a circular arc of diameter D, is subtending a central angle α. Furthermore, the cross-section of the toroidal surface 208*a* has a diameter represented by d. The angle α is determined by the width of tip of the reed 232. As the contact force increases, the contact interface becomes a curved rectangular region 244 as shown in FIG. 2*e*.

During contact, a Von Mises stress distribution exists having a maximum Von Mises stress value at a certain location within the probe and reed contact members. It is desirable to select the curvature of the shape of at least one of the contact members to adjust the location of the maximum Von Mises stress value to reduce the stresses within the plated layers and the metallic substrate of the contact members. It is also desirable to adjust the location of the maximum stress value to reduce the magnitude of the stress distribution as explained below. Furthermore, it is preferable for the Von Mises stress values to be lower than the yield stress of the material in which the stress value exists in order to reduce the degree of plastic deformation of the material.

The maximum contact pressure ($p_o$) in the contact region of either the probe or the reed is given by:

$$p_o = \frac{2 \cdot F}{\pi \cdot b \cdot L} \tag{2}$$

where b is the half-width of the curved rectangular region 244 and F is the contact force. The parameter L is the length of the mean curved rectangular contact interface 244 and is given by equation 3.

$$L = \frac{\alpha \cdot D}{2} \tag{3}$$

where α is in radians. The mean diameter D is given by the requirement that the various reeds 216, 220 and 232 do not touch each other when making contact with the probe 208. Furthermore, the diameter D is given by a minimum stray capacitance requirement (i.e. the contact region and the ground plane form a stray capacitance there between which is mitigated by having a smaller diameter D). The half-width b may also be calculated according to the properties of the materials used to construct the probe and the reed. The half-width b is given by:

$$b = \left[\frac{2 \cdot F \cdot d}{\pi \cdot L} \cdot \left(\frac{1 - v_{REED}^2}{E_{REED}} + \frac{1 - v_{PROBE}^2}{E_{PROBE}}\right)\right]^{\frac{1}{2}} \tag{4}$$

where $V_{REED}$ and $V_{PROBE}$ are the Poisson ratios for the reed and probe materials respectively, $E_{REED}$ and $E_{PROBE}$ are the values of Young's modulus for the reed and probe materials respectively (K. L. Johnson, *Contact Mechanics*, @ 1985 and J. E. Shigley et al., *Standard Handbook of Machine Design*, @ 1996).

The principal stresses $\sigma_x$, $\sigma_y$ and $\sigma_z$ in the x, y and z directions respectively for the contact interface due to the maximum pressure $p_o$ are given by:

$$\sigma_x = -2 \cdot v_{PROBE} \cdot p_o \cdot \left[\left(1 + \frac{z^2}{b^2}\right)^{1/2} - \frac{z}{b}\right] \tag{5}$$

$$\sigma_y = -p_o \cdot \left[\left(2 - \frac{1}{1 + \frac{z^2}{b^2}}\right) \cdot \left(1 + \frac{z^2}{b^2}\right)^{1/2} - \frac{2 \cdot z}{b}\right] \tag{6}$$

$$\sigma_z = \frac{-p_o}{\left(1 + \frac{z^2}{b^2}\right)^{1/2}} \tag{7}$$

where z is the depth of the location of the maximum Von Mises stress value from the contact interface surface. The Von Mises stress (σ) is given then by equation 8.

$$\sigma = \frac{1}{2}\sqrt{(\sigma_x - \sigma_y)^2 + (\sigma_y - \sigma_z)^2 + (\sigma_x - \sigma_z)^2} \tag{8}$$

Yielding (or plastic deformation) occurs when Von Mises stress exceeds the yield strength of the material. Note that equations 5 to 7 hold for the probe and one must substitute $V_{REED}$ into equation 5 to determine the stresses in the reed contact member.

In the case of contact members which have a plating layer, a correction factor must be applied to the Von Mises stresses calculated in equations 5 to 8. The corrected Von Mises stress is provided by equation 9 (A. G. Tangena et al., "Calculations of Mechanical Stresses in Electrical Contact Situations", IEEE Trans. On Components, Hybrids, and Manufacturing Technology, Vol. CHMT-8, NO. 1, March 1985):

$$\sigma_F^{MAX} = \sigma_M^{MAX} \cdot \frac{(0.5 - v_F)}{0.62} \cdot \left(\frac{E_s \cdot (1 - v_F^2)}{E_F \cdot (1 - v_S^2)}\right)^{2/3} \tag{9}$$

where $\sigma_F^{MAX}$ is the maximum Von Mises stress in the plating layer, $\sigma_M^{MAX}$ is the maximum Von Mises stress in the metallic substrate (calculated in equation 8), $E_F$ and $E_S$ are the values of Young's modulus for the materials used for the plating layer and the metallic substrate respectively, and $v_F$ and $v_S$ are the Poisson ratios for the materials used for the plating layer and the metallic substrate respectively.

Hertz theory dictates that the maximum stress occurs at a location having a certain depth beneath the contact interface for non-conforming surfaces. Accordingly, it is desirable for the maximum Von Mises stress to occur at a certain location in the z direction (i.e. depth) within the metallic substrate underneath the contact region of at least one of the probe and the reed contact members and preferably both of these members. Equations 5 to 8 allow for the calculation of the approximate location or depth (z) at which the maximum Von Mises stress occurs which depends on the properties of the materials used for the reed and probe contact regions as well as the radius of curvature for the toroidal surface of the probe contact region. Therefore it is possible to calculate a radius of curvature for the toroidal cross-section such that the maximum stress will occur within the metallic substrate region and not in the plating layer of at least one of the probe and reed contact regions. This is desirable since the plating layer is typically characterized by lower mechanical properties than the metallic substrate.

As it can be seen in relation 9, the maximum Von Mises stresses in the plated material $\sigma_F^{MAX}$ depends on both the radius of curvature d/2 and the plating thickness. Therefore, it is possible to choose the radius of curvature such as to reduce, for a given thickness, the stresses in the plated layer. However, it should be noted that the plating thickness is dictated by the RF properties of the switch contact and preferably has a thickness of at least three skin depths to accommodate RF current flow.

Figure 2F:
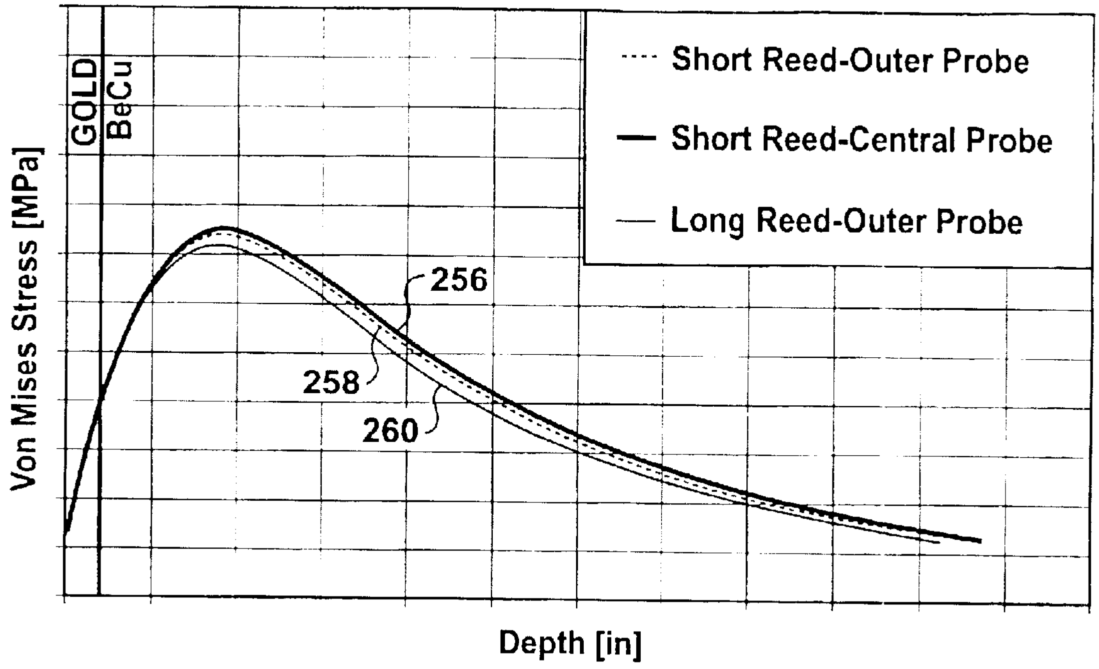
FIG. 2*f* is a plot of Von Mises stress versus depth for several probe-reed contact configurations.

Referring now to FIG. 2*f*, shown therein is a plot of Von Mises stress versus depth for three types of contacts: a contact between a short reed and an outer probe, a contact between a short reed and a central probe and a contact between a long reed and an outer probe represented by the reference numerals 256, 258 and 260 respectively. The plot shows the range of depth values that correspond to a gold plating layer (i.e. to the left of line 262) and the range of depth values that correspond to a beryllium-copper metallic substrate (to the right of line 262). The results indicate that the maximum Von Mises stress for each type of contact occurs at a certain depth within the beryllium-copper metallic substrate. The use of gold plating layers and beryllium-copper metallic substrates are shown for exemplary purposes and other types of suitable materials may be used.

Figure 2G:
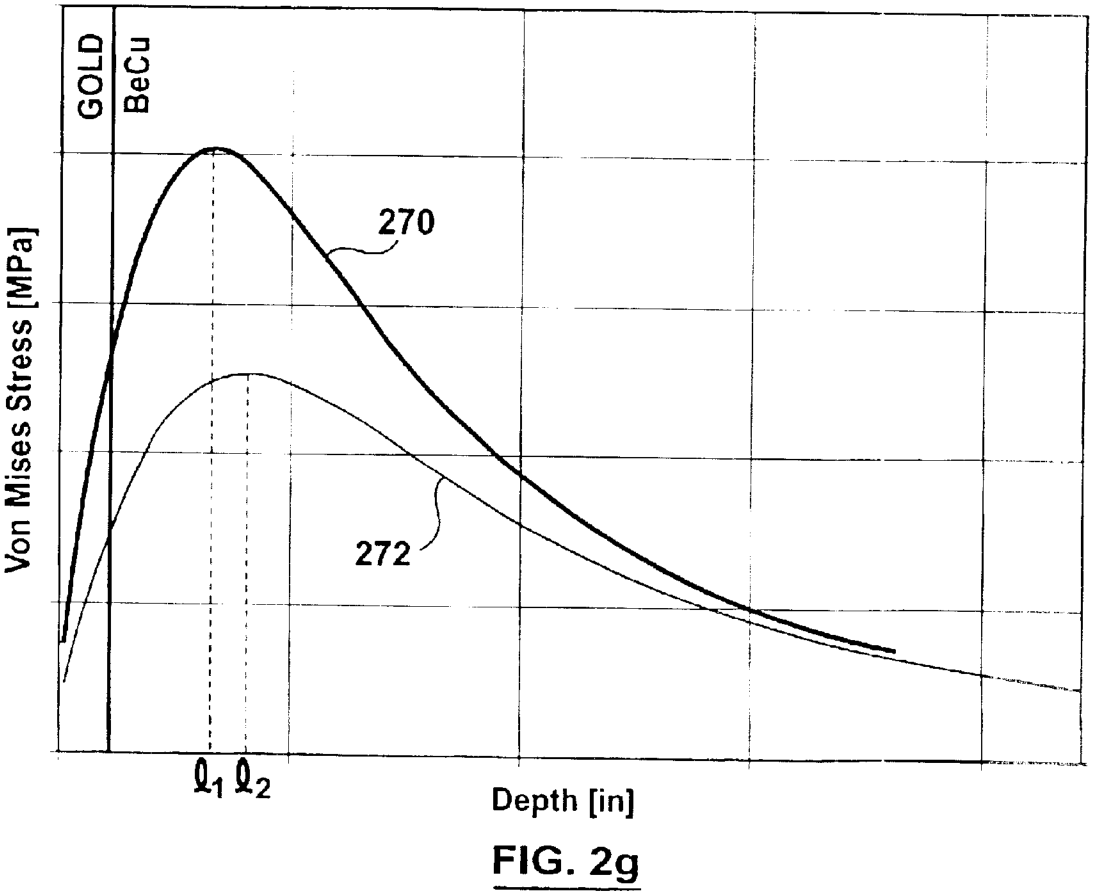
FIG. 2*g* is a plot of Von Mises stress versus depth for a contact member having two different radii of curvature.

Referring now to FIG. 2*g*, shown therein is a plot of Von Mises contact stress versus depth for two different probe contact members having different radii of curvature. Curve 270 shows the contact stress distribution for a probe with a radius of curvature of d and curve 272 shows the contact stress distribution for a probe with a radius of curvature 2*d*. FIG. 2*g* shows that by selecting a different radius of curvature, the magnitude of the contact stress distribution can be reduced. Furthermore, as mentioned previously, the location of the maximum contact stress is placed at a different depth within the contact member (i.e. location $I_1$ VS $I_2$). This effect of radii of curvature on the magnitude of the stress distribution is applicable to the other switch contact embodiments that are discussed further below.

By reducing the magnitude of the stress distribution in both contact members, wear and tear on the surfaces of the contact members is reduced. This results in a contact interface having a lower and more reliable contact resistance which also increases the lifetime of the microwave switch 200. This property also holds true for the other microwave switch embodiments which are discussed in further detail below.

It should be noted that a larger radius of curvature can be iteratively selected until a "minimum" contact stress distribution occurs. In other words, selecting an incrementally larger radius of curvature will result in the contact stress distribution having smaller values of stress. However, there will be a point when selecting a larger radius of curvature will result in a contact stress distribution having larger values of stress because, at this point, the radius of curvature is so large that the reed and probe contact regions begin to act as a complete mechanical contact.

It should also be noted that the magnitude and shape of the contact stress distribution experienced by the reed and probe contact members will depend on the materials and the radii of curvature used for each contact member. It should also be mentioned that the equations given above provide approximate values and for more accurate results, a Finite element analysis program may be used as is commonly known to those skilled in the art. These programs include Abaqus™, Pro Mechanica Structure™, IDEAS™, etc. Those skilled in the art will understand how the contacts can be modeled using a Finite Element program and the parameters of interest that should be inputted which include the geometry of the contact structures, the material properties, the contact forces, etc.

In accordance with the above discussion, a method for calculating the radius of curvature of a probe contact member for reducing the magnitude of the contact stress (Von Mises) distribution comprises:

a. Calculating the contact pressure ($p_o$) and half-widths (b) for several values of the radius of curvature (d/2) of the toroidal probe using equations 2 to 4;
b. Calculating the Von Mises stresses using equations 5 to 8 for various depths z;
c. Applying the correction factor given by equation 9 to calculate the maximum stress in the plating layer; and,
d. Selecting a desired radius of curvature (d/2) of the toroidal probe to reduce the stress within the contact members.

Step d may preferably include selecting the desired radius of curvature so that the maximum stress does not occur with the plated layer of the contact members. Alternatively, step d may include selecting the desired radius of curvature such that the magnitude of the contact stress distribution is minimized in at least one of the contact members.

The constriction resistance ($R_c$) in Ohms for the contact formed by the contact members shown in FIGS. 2*a* to 2*c* is given by:

$$R_C = \rho\cdot\left(\frac{1}{2\cdot n\cdot a}+\frac{1}{2\cdot R_H}\right) \tag{10}$$

where: ρ is the resistivity of the material used in the plating layers, n is the number of a-spots, a is the radius of an a-spot and $R_H$ is the Holm radius in (R. Holm, *Electric Contacts*, @ 1963). The Holm radius is the radius of a circle that encompasses all the a-spots clusters.

Figure 3B:
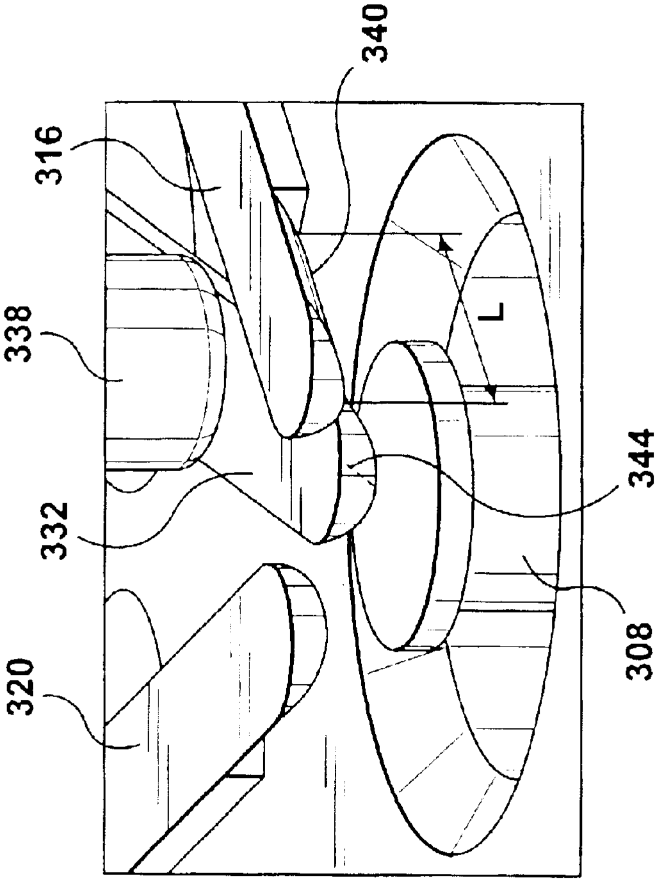
FIG. 3*b* is a magnified view of the reeds and probes of FIG. 3*a* showing a contact made between a short reed and a probe.
Figure 3C:
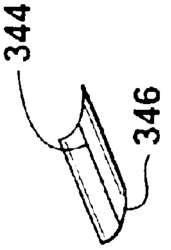
FIG. 3*c* shows a curvilinear contact interface formed during the initial contact of a reed and probe shown in FIGS. 3*a* to 3*b* and the shape of the contact interface when there is an increased contact force during contact between the reed and the probe.
Figure 3A:
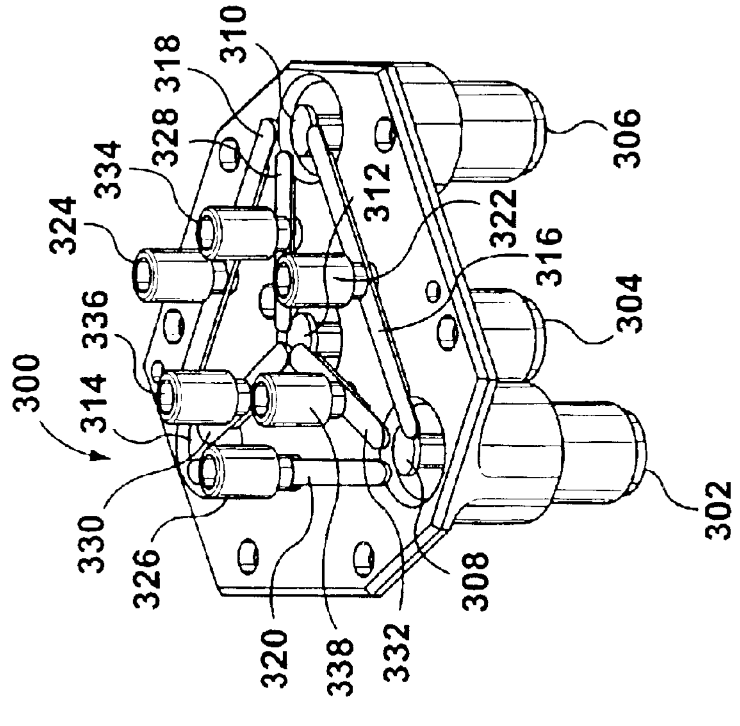
FIG. 3*a* is a partial view of an RF module having an alternative embodiment of probes and reeds with non-conformal contact regions in accordance with the present invention.

Referring now to FIG. 3*a*, shown therein is a partial view of an alternative embodiment of an RF module 300 for a T-switch in which the RF cover, dielectric pins and central walls have been removed. The RF module 300 has similar components to those shown for the RF module 200 and are therefore numbered in a similar fashion. However, in contrast to the RF module 200, each probe 308, 310, 312 and 314 in the RF module 300 has a flat contact region and each reed 316, 318, 320, 328, 330 and 332 has a curved cylindrical contact region. As shown in FIG. 3, the axis of the cylinder is substantially parallel to the longitudinal axis of the reed. However, in alternative embodiments, the axis of the cylindrical tip of the reed may be varied with respect to the longitudinal axis of the reed. The curved cylindrical contact regions of the reeds and the flat contact regions of the probes also provide an incomplete mechanical contact. A magnified view of the contact regions is shown in FIG. 3*b* in which the reed 332 is making contact with the probe 308. Using reed 316 as an example, each reed has a contact region 340 that is characterized by a cylinder having a radius of curvature R and a length L. The dimensions of the contact region 340 are chosen such that they are less than a quarter of a wavelength so as to introduce only small changes in the RF characteristics of the contact.

The contact interface begins as a straight line 344 as shown in FIG. 3*c* along which the a-spot clusters are located but as the contact force increases, the contact interface becomes a curved rectangular region 346 as shown in FIG. 3*c*. Similarly to the reeds and probes of the RF module 200, the contact made by the probes and reeds of the RF module 300 may be described as a cylindrical contact region making contact with a flat contact region. Accordingly, equations 4 to 9 are applicable (L is no longer given by equation 2 but by the dimension shown in FIG. 3*b*) to calculate the stresses and determine a radius of curvature R to reduce or minimize the values of the stress distribution in at least one of the contact members. Preferably, the radius of curvature R is selected so that the maximum stress occurs in the metallic substrate rather than the metallic plating layers of at least one of the probe and the reed contact members. Furthermore, equation 10 may be used to determine the constriction resistance. As previously mentioned, finite element modeling packages may be used to obtain more accurate results.

Referring now to FIG. 4*a*, shown therein is a partial view of another alternative embodiment of an RF module 400 for a T-switch in which the RF cover, dielectric pins and central walls have been removed. The RF module 400 has similar components to those shown for the RF module 300 and are therefore numbered in a similar fashion. However, the RF module 400 combines the surfaces of the contact regions shown for the RF modules 200 and 300. Accordingly, each probe 408, 410, 412 and 414 has a toroidal contact region as shown in FIGS. 2*b* and 2*c* and each reed 416, 418, 420, 428, 430 and 432 has a curved cylindrical contact region as shown in FIG. 3*b*. The curved cylindrical contact regions of the reeds and the toroidal contact regions of the probes provide an incomplete mechanical contact during operation. The reeds and probes of the RF module 400 may be described as a cylindrical contact region making contact with another cylindrical contact region. These shapes used for the contact regions of the contact members provide robustness to misalignments, predictable contact force and predictable wipe.

Magnified views of the contact regions are shown in FIGS. 4*b* and 4*c*. FIG. 4*b* shows a contact 440 made between the long outer reed 416 and the probe 408 having a curved rectangular contact interface. FIG. 4*c* shows a contact 442 made between the short inner reed 432 and the probe 408 having an elliptical contract interface. The contact 440 is due to a tangential contact between two cylinders which have substantially parallel axes. The contact 442 is known as a cross-rod type contacts in which the surfaces of the probe contact region and the reed contact region behave as two cylinders crossed at a certain angle. The two cylinders preferably have different radii of curvature in which case the contact interface has an elliptical shape as shown in FIGS. 4*b* and 4*c*. A high aspect ratio is preferred for the elliptical shape of the contact interface so that the contact resistance decreases in magnitude. Preferably the radius of curvature of the surface of the probe contact region is made larger than the radius of curvature of the surface of the reed contact region since this provides greater stability when the reed is contacting the probe. Alternatively, the radius of curvature of the surface of the reed contact region may be made larger than the radius of curvature of the surface of the probe contact region.

The generalized formulae for the calculation of the Von Mises contact stresses in the embodiment of FIG. 4 is given by the following equations. For, the ellipse semi-axes:

$$\begin{cases} a = f \cdot \left[\dfrac{3 \cdot F \cdot (\theta_1 + \theta_2)}{8 \cdot R}\right]^{\frac{1}{3}} \\ b = g \cdot \left[\dfrac{3 \cdot F \cdot (\theta_1 + \theta_2)}{8 \cdot R}\right]^{\frac{1}{3}} \end{cases} \quad (11)$$

where: F is the contact force, a is a major ellipse semi-axis, and $$\begin{cases} R = \dfrac{2}{d_1} + \dfrac{2}{d_2} \\ \theta_1 = 4 \cdot \dfrac{(1 - \nu_1^2)}{E_1} \\ \theta_2 = 4 \cdot \dfrac{(1 - \nu_2^2)}{E_2} \end{cases} \quad (12)$$

where $d_1$ and $d_2$ are the diameters (i.e. twice the value of the radii of curvature) of the cylindrical surfaces of the probe and reed contact regions; $\upsilon_1$, $\upsilon_2$ and $E_1$, $E_2$ are the Poisson's ratios and Young Modulus respectively for the materials used for the substrates of the two cylindrical surfaces and:

$$\begin{cases} f = \left[\dfrac{2 \cdot I(k)}{\pi \cdot [\sin(\Omega/2)^2]}\right]^{\frac{1}{3}} \\ g = \left[\dfrac{2 \cdot J(k)}{\pi \cdot [\sin(\Omega/2)^2]}\right]^{\frac{1}{3}} \end{cases} \quad (13)$$

In formula (13) Ω is given by:

$$\begin{cases} R_1 = \dfrac{2}{d_1} \\ R_2 = \dfrac{2}{d_2} \\ \cos(\Omega) = \dfrac{\sqrt{R_1^2 + R_2^2 + 2 \cdot R_1 \cdot R_2 \cdot \cos(\omega)}}{R} \end{cases} \quad (14)$$

where: in addition to the notations already used in equation (11) to (13) ω is the angle between the cylindrical axes of the two cylindrical surfaces. The two integrals in formula (13) are given by:

$$\begin{cases} I(k) = \displaystyle\int_0^{\infty} \frac{dt}{\sqrt{(1 + k^2 \cdot t^2)^3 \cdot (1 + t^2)}} \\ J(k) = \displaystyle\int_0^{\infty} \frac{dt}{\sqrt{\left(1 + \frac{t^2}{k^2}\right)^3 \cdot (1 + t^2)}} \end{cases} \quad (15)$$

Where the ratio k=b/a is the root of the transcendental equation:

$$\frac{k^3}{\tan^2\left(\frac{\Omega}{2}\right)} - \frac{J(k)}{I(k)} = 0 \quad (16)$$

The maximum contact pressure ($p_o$) is given by:

$$p_o = \frac{3 \cdot F}{2 \cdot \pi \cdot a \cdot b} \quad (17)$$

The above relations are highly non-linear and their solution can be done only numerically. An algorithm for solving this problem in the most general case is given by Emil W. Deeg, "New Algorithms for Calculating Hertzian Stresses, Deformations, and Contact Zone Parameters", AMP Journal of Technology Vol. 2 Nov. 1992. Another possible approach involves the use of the Finite Element Method (as mentioned previously, there are a number of commercially available programs with contact analysis capabilities). The principal stresses are provided by the programs.

It is also possible to use identical radii of curvature for the probe and reed contact regions. In this case, for the short reed, the elliptical contact interface degenerates into a circle and the contact interface region becomes smaller. In the case of the long reed the contact interface is equivalent with the contact between two cylinders with substantially parallel axes and the contact interface becomes a curved rectangle.

For a circular contact interface, the maximum contact pressure ($p_o$) is given by:

$$p_o = \frac{3 \cdot F}{2 \cdot \pi \cdot a^2} \tag{18}$$

where F is the contact force. The parameter a is the radius of the contact interface given by:

$$a = \left( \frac{3 \cdot F \cdot d}{8} \cdot \frac{1 - \upsilon^2}{E} \right)^{1/3} \tag{19}$$

where: υ is Poisson's ratio for the material used for the probe contact region, E is Young's modulus for the material used for the probe contact region and d is the diameter corresponding to the radius of curvature for the two cylindrical probe and reed contact regions.

The principal stresses in the x, y and z directions for the circular contact interface are given by:

$$\sigma_x = \sigma_y = -p_o \cdot \left[ \left( 1 - \frac{z}{a} \cdot \tan^{-1}\left(\frac{a}{2}\right) \right) \cdot (1 + \upsilon) - \frac{1}{2 \cdot \left( 1 + \frac{z^2}{a^2} \right)} \right] \tag{20}$$

$$\sigma_z = \frac{-p_o}{\left( 1 + \frac{z^2}{a^2} \right)} \tag{21}$$

The Von Mises stress is given by equation 8 and the correction factor due to the use of plating layers is given by equation 9.

For the long reed case the maximum contact pressure ($p_o$) is given by:

$$p_o = \frac{2 \cdot F}{\pi \cdot bl} \tag{22}$$

where: F is the contact force and I is the length on the contact area. The parameter b is half of the width of the contact interface given by:

$$b = \left( \frac{F \cdot d}{\pi \cdot l} \cdot \frac{1 - \upsilon^2}{E} \right)^{1/2} \tag{23}$$

The principal stresses in the x, y and z directions for the circular contact interface are given by:

$$\sigma_x = -2 \cdot v \cdot p_0 \left[ \left( 1 + \frac{z^2}{b^2} \right)^{1/2} - \frac{z}{b} \right] \tag{24}$$

$$\sigma_y = -p_0 \left[ \left( 2 - \frac{1}{1 + \frac{z^2}{b^2}} \right) \cdot \left( 1 + \frac{z^2}{b^2} \right)^{1/2} - \frac{2 \cdot z}{b} \right] \tag{25}$$

-continued $$\sigma_z = \frac{-p_0}{\left( 1 + \frac{z^2}{b^2} \right)^{1/2}} \tag{26}$$

The Von Mises stress is given by equation 8 and the correction factor due to the use of a metallic plating layer is given by equation 9. The appropriate Poisson ratio for the reed or the probe contact member would be inserted into equation 24 depending for which contact member the contact stress distribution is being calculated.

A method for calculating the radius of curvature for reducing the magnitude of the stress within at least one of the contact members for the embodiment shown in FIG. 4 comprises:

a. Selecting a contact interface from one of an elliptical contact interface, a circular contact interface and a curved rectangular contact interface;

b. Calculating the maximum contact pressure ($p_o$) and ellipse semi-axes (a) and (b) for several values of the radii of curvature ($d_1/2$) of the probe and ($d_2/2$) of the reed using equations 11 to 16 and 17 for an elliptical contact interface; using equations 18 and 19 for a circular contact interface and equations 20 and 22 for a curved rectangular contact interface;

c. Calculating the Von Mises stresses for various depths using finite element modeling for the elliptical contact interface case, using equations 20, 21 and 8 for the circular contact interface case and equations 24 to 26 and 8 for the curved rectangular contact interface case;

d. Applying the correction factor given by equation 9 to calculate the stresses in the plating layer; and, e. Selecting a first desired radius of curvature ($d_1/2$) for the toroidal probe and a second desired radius of curvature ($d_2/2$) for the cylindrical reed to reduce the stress within at least one of the probe and reed contact members.

Step d may preferably include selecting the first and second desired radii of curvature so that the maximum stress does not occur within the plated layer of the contact members. In addition, step d may include selecting the radii of curvature such that the magnitude of the contact stress distribution is minimized. This will occur for a given combination of the radii of curvature beyond which increasing the radii of curvature will result in a contact stress distribution having a larger magnitude since the two surfaces will start behaving as complete mechanical contacts.

It should be noted that if the radius of curvature has to be selected for a probe which is contacted by short and long reeds, then a compromise may be made in this selection for reducing the stress occurring underneath the surfaces of each of the probe contact member, the long reed contact member and the short reed contact member.

Figure 5A:
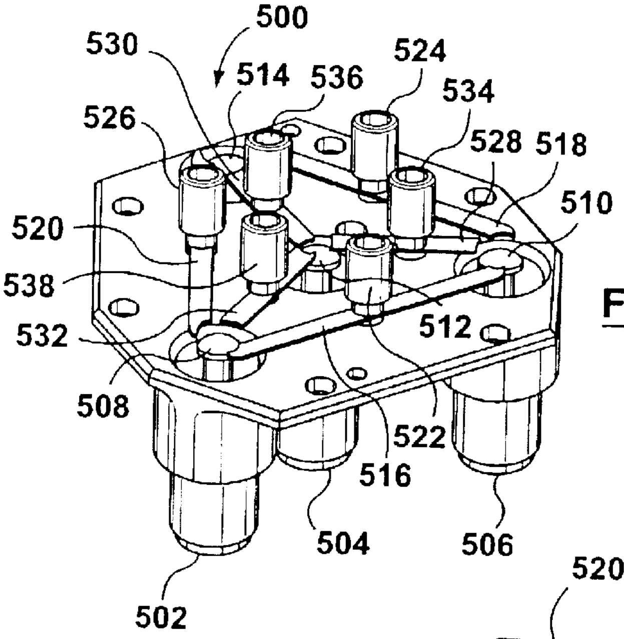
FIG. 5*a* is a partial view of an RF module having another alternative embodiment of probes and reeds with non-conformal contact regions in accordance with the present invention.

Referring now to FIG. 5*a*, shown therein is a partial view of another alternative embodiment of an RF module 500 for a T-switch in which the RF cover, dielectric pins and central walls have been removed. The RF module 500 has similar components to those shown for the RF module 200 and are therefore numbered in a similar fashion. However, the RF module 500 has probes 508, 510, 512 and 514 with a contact region having a domed surface and reeds 516, 518, 520, 528, 530 and 532 each having a concave-arced contact region defined by removing a portion of the tips of each reed. The domed contact regions of the probes and the concave-arced contact regions of the reeds provide an incomplete mechanical contact during operation of the microwave switch. This is due to the fact that the two surfaces in contact are the cylindrical or spherical surface of the probe and a cylindrical like surface of the reed given by the rounded edges around the concave-arced contact line.

Figure 5B:
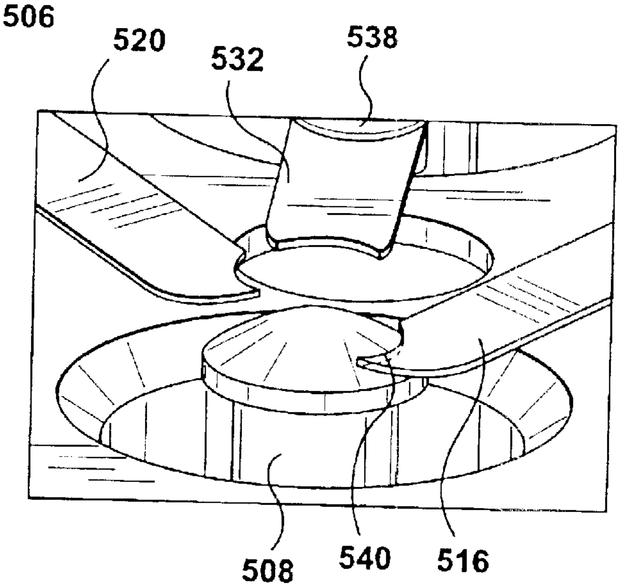
FIG. 5*b* is a magnified view of the reeds and probes of FIG. 5*a* showing a contact made between a long reed and a probe.
Figure 5C:
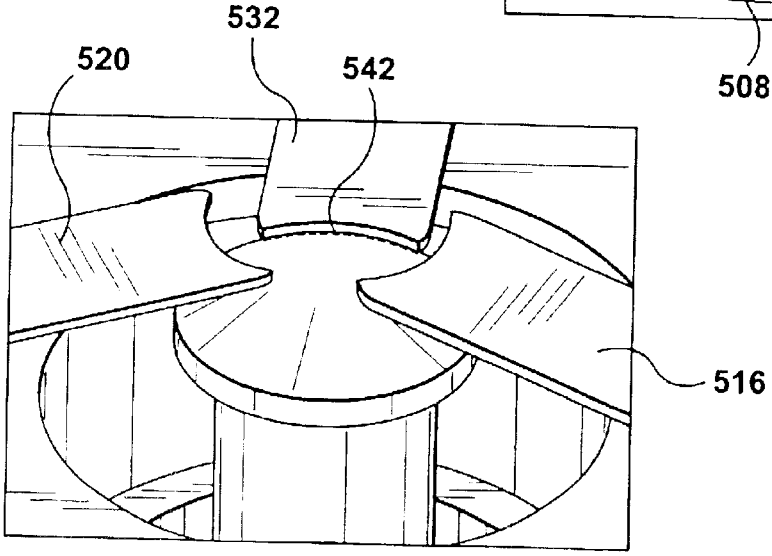
FIG. 5*c* is a magnified view of the reeds and probes of FIG. 5*a* showing a contact made between a short reed and a probe.
Figure 5D:
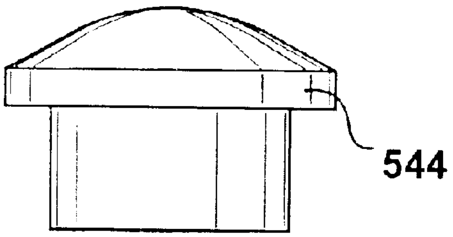
FIG. 5*d* is a diagram of a probe having a conical contact region.
Figure 5E:
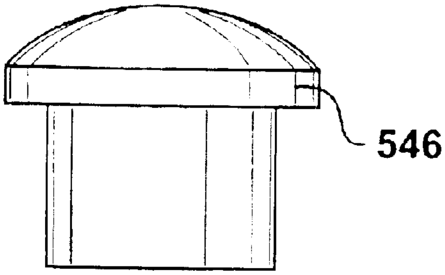
FIG. 5*e* is a diagram of a probe having a spherical contact region.

Magnified views of the contact regions are shown in FIGS. 5*b* and 5*c*. FIG. 5*b* shows a curvilinear contact 540 made between the long outer reed 516 and the probe 508 along which the a-spot clusters are located. FIG. 5*c* shows a curvilinear contact 542 made between the short inner reed 532 and the probe 508 along which the a-spot clusters are located. In both cases, when the contact force is increased, the contact interface becomes a curved rectangle as shown in FIG. 2*e*. The radius of curvature of the concave-arced reed contact regions preferably has a slightly larger radius than the curvature of the domed-shaped probe that each reed makes contact with. This provides for a good wiping action, avoiding reed tilting during contact and also ensuring that the tip of a reed does not dig into the top of a probe. For this reason, it is also not preferable to use sharp edges on the concave-arced reed contact regions. In addition, the domed-shaped probe can be either conical as shown at 544 in FIG. 5*d* or spherical as shown at 546 in FIG. 5*e*. Furthermore, the reeds used in the RF module 500 shown in FIGS. 5*a*–5*c* are thinner than the reeds used in the RF modules 200, 300 and 400 to provide for controlled wiping as explained further below.

Similarly to the reeds and probes of the RF module 200, the contact made by the probes and reeds of the RF module 500 may be described as a cylindrical contact region making contact with a flat contact region. Accordingly, equations 2 to 9 are applicable to calculate the stresses and determine a radius of curvature d/2 for the edges of the concave-arced shaped tip of a reed such that the contact stress within at least one of the contact members is reduced or minimized. Preferably, the radius of curvature is determined such that the maximum stress occurs in the metallic substrate rather than the metallic plating layers. Furthermore, equation 10 may be used to determine the constriction resistance. In equations 2 to 10, b, L, $\alpha$ and D relate to the curved rectangular contact interface as defined in FIG. 2 and d/2 is the radius of curvature of the edges of the concave-arced contact region.

Figure 6A:
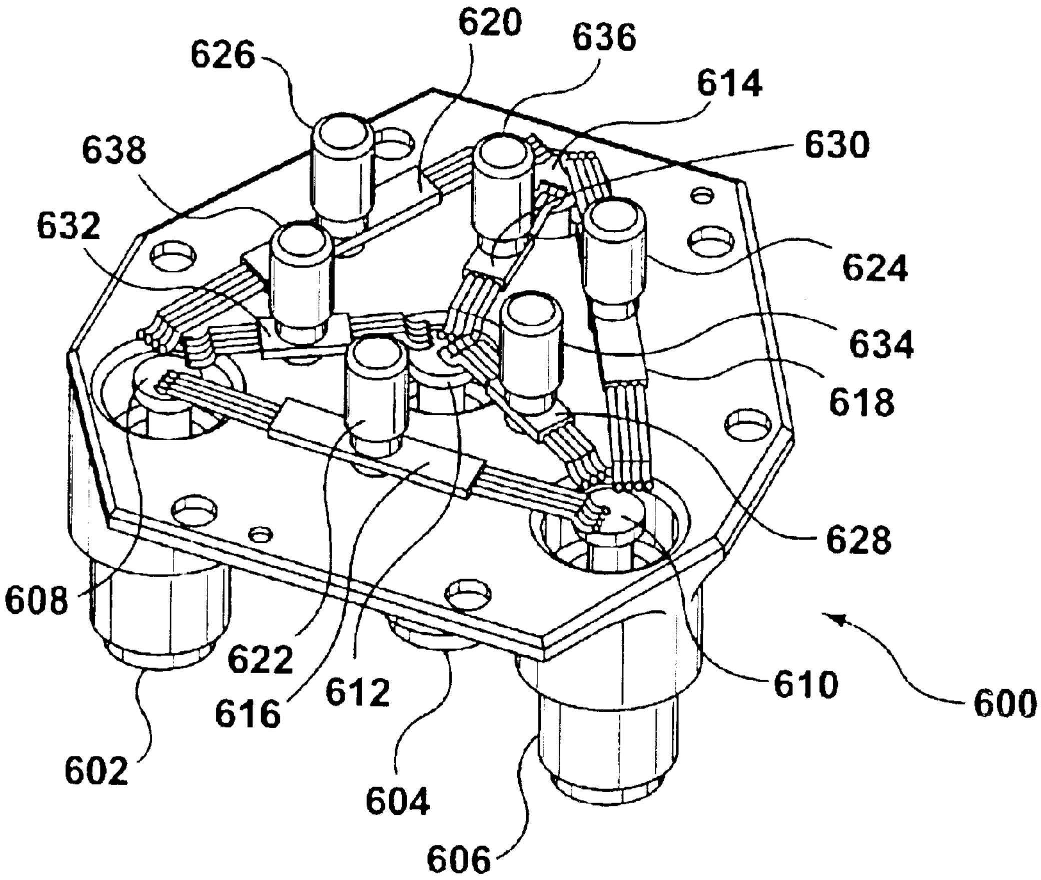
FIG. 6*a* is a partial view of an RF module having another alternative embodiment of probes and reeds with non-conformal contact regions in accordance with the present invention in which the probes have a flat contact region and the reeds have a brush-type contact region.

Referring now to FIG. 6*a*, shown therein is a partial view of another alternative embodiment of an RF module 600 for a T-switch in which the RF cover, dielectric pins and central walls have been removed. The RF module 600 has similar components to those shown for the RF module 300 and are therefore numbered in a similar fashion. However, the RF module 600 has probes 608, 610, 612 and 614 with a contact region having a flat surface and brush-type reeds 616, 618, 620, 628, 630 and 632 having a plurality of finger-like conductors that each provide a contact region. The ends of the fingers are curved upwards such that the contact region of a reed makes an incomplete contact with the contact region of a probe. The contact interface begins as a curved line and then increases to a curved rectangle as shown in FIGS. 2*d* and 2*e*. The backwards curving of the ends of the fingers is also preferable for preventing scratching of the probe surface. The fingers of the reed are compliant to provide for a good wiping action.

In this embodiment, the reed provides a plurality of quasi-independent contact regions with the contact region of a domed probe (i.e. four separate contacts are made when a brush-type reed contacts a probe). Accordingly, the fingers may preferably be compliant such that they can move independently one from another. This provides for redundancy in case there is some particulate matter that is prohibiting the formation of a contact between one of the fingers and the contact region of the probe. Hence the reliability of the contact will be increased. In the case of n contact fingers, the probability of failure is given by:

$$P\left(\frac{F}{n}\right) = e^{\left[-\left(\frac{F}{F_0}\right)^{\varepsilon}\cdot n^{(1-\varepsilon)}\right]} \tag{27}$$

where P is the probability of failure, n is the number of redundant contacts (i.e. fingers), F is the contact force, and $F_0$ and $\epsilon$ are constants which depend on the number of fingers of a contact and can be estimated (K. E. Pitney, *NEY Contact Manual: Electrical Contacts For Low Energy Uses*, The J. M NEY Company, @ 1973).

In addition, the four separate contacts formed by the fingers of a reed provide a parallel connection between a reed and a probe. Accordingly, if the contact formed between one of the fingers and the probe has a large resistance, its influence on the overall contact resistance will be decreased since the contact resistance is the combination of the parallel resistances of four contacts. Accordingly, providing a plurality of contact regions in parallel allows for a reduction of the contact resistance. The length of each finger is preferably only a fraction of $\lambda/4$. Furthermore, four fingers have been shown for exemplary purposes. Reeds may be used which have two, three, four or more fingers.

Similarly to the reeds and probes of the RF module 400, the contacts made by the probes and reeds of the RF module 600 may be described as a cylindrical contact region making contact with a flat contact region. Accordingly, equations 2 to 9 can be used to calculate the stresses and determine a radius of curvature d/2 for the tips of the fingers such that the magnitude of the contact stress distribution is reduced or minimized. This may preferably include placing the location of the maximum contact stress occurs in the metallic substrate rather than the metallic plating layers. Furthermore, equation 10 may be used to determine the constriction resistance. In equations 2 to 10, b, L, $\alpha$ and D relate to the curved rectangular contact interface as defined in FIG. 2 and d/2 is the radius of curvature of the tip of a finger. These calculations can be done for each finger of a reed.

Figure 6B:
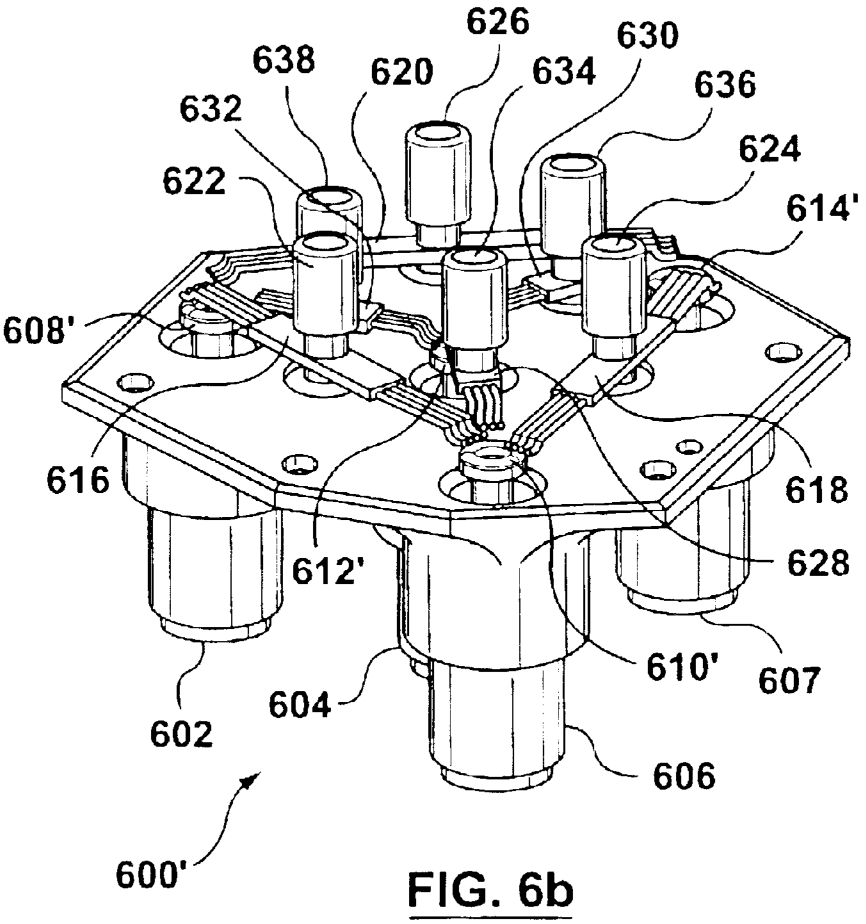
FIG. 6*b* is a partial view of an RF module having another alternative embodiment of probes and reeds with non-conformal contact regions in accordance with the present invention in which the probes have a toroidal contact region and the reeds have a brush-type contact region; and, FIG. 6*c* is a diagram of an alternative embodiment for the reeds of FIGS. 6*a* and 6*b;*

Referring now to FIG. 6*b*, shown therein is a partial view of another embodiment of an RF module 600' for a T-switch in which the RF cover, dielectric pins and central walls have been removed. The RF module 600' has similar components to those shown for the RF module 600 and are therefore numbered in a similar fashion except for the four probes 608', 610', 612' and 614' which each have toroidal contact regions. The same brush-type reeds 616, 618, 620, 628, 630 and 632 of FIG. 6*a* having a plurality of fingers which each provide a contact region are used. The ends of the fingers are curved upwards such that the contact region of a reed makes an incomplete contact with the contact region of a probe. The fingers of the reeds are also compliant for the reasons stated above.

Similarly to the reeds and probes of the RF module 400, the contacts made by the probes and reeds of the RF modules 600' may be described as a cylindrical contact region, making contact with another cylindrical region. Accordingly, depending on the shape of the contact interface, the appropriate equations from equations 11 to 26 and/or finite element modeling can be used to calculate the stresses and determine radii of curvature for the cylindrical contact regions to reduce or minimize the magnitude of the stress distribution within the contact members. This may preferably include locating the maximum stress in the metallic substrate rather than the metallic plating layer of the contact members.

Figure 6C:
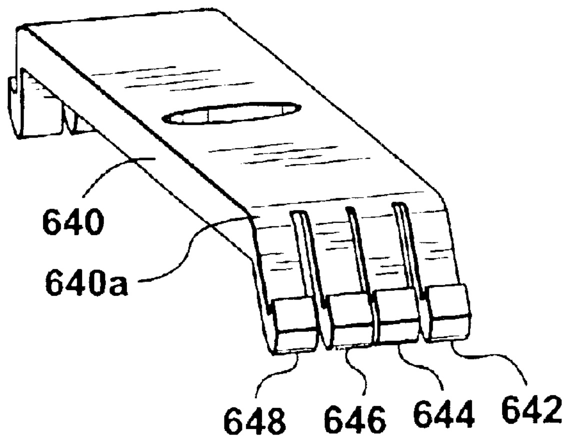

FIG. 6*c* shows an alternate brush-type reed 640 in which the fingers 642, 644, 646 and 648 are formed to be an extension of the one-piece RF reed 640. Accordingly, the brush-type reed 640 is less compliant than the brush-type reeds shown in FIGS. 6*a* and 6*b*. The fingers of the stiffer brush-type reed 640 will not be as independent as the fingers of the brush-type reeds of FIGS. 6*a* and 6*b*. Accordingly, equation 27 may not wholly be applicable to the contact, which utilizes brush-type reeds 640. The usage of the particular brush-type reeds of FIGS. 6*a* and 6*b* or 6*c* may depend on manufacturing preferences.

In addition to the stress-based criteria given in each of the embodiments above for the dimensions of the surface features on the probe and reed contact regions, there are also microwave-based criteria for the dimensions of the surface features that are preferably satisfied to provide good RF performance. For instance, the dimensions of these features are preferably chosen to have a minimal effect on the RF properties of these microwave switches.

The contact members shown in RF modules 200, 300, 400, 500, 600 and 600' are robust to misalignment of any of the contact members because the shape of the contact interface (or the cross-section of the contact region) remains substantially similar regardless the misalignment. This is due to the fact that each tip of the reed contact region always forms a non-conformal contact with the probe contact region as described in the various embodiments discussed above. Accordingly, if there is a rotation about the longitudinal axis of a reed, there will always be a similar contact interface made on the curved surface of at least one of the reed and the probe contact members. Consequently, the contact members are robust to misalignment which may, in prior art microwave switches, result in the abrasion of a probe contact by a reed contact thereby damaging the probe contact. Misalignment is defined as having probe contact members with different heights or having a reed that is titled along its longitudinal or transversal axis. In the embodiments described herein, since a contact is comprised of at least one contact member having a radius of curvature, a reed contact member will not abrade (i.e. dig into) a probe contact.

Referring to RF module 200, the probes have a toroidal shape with a curved upper portion, which is first contacted by the underside of a reed tip. Therefore, the reed tip will not abrade the probe but will wipe the surface of the probe as the contact force increases and the reed flexes. If the reed is angled along its longitudinal axis, the tip of the reed will still make contact with a portion of the upper surface of the probe and will not abrade the probe. Accordingly, a variety of tilting angles for the reed can be accommodated. These points just discussed also hold true for the reeds and probes of RF modules 400 and 600'.

Referring now to RF module 300, each reed has a tip with a cylindrical radius of curvature, which makes contact with a flat probe. Since the end of the reed tip is rounded rather than flat, the reed does not abrade the probe but will wipe the surface of the probe as the contact force increases and the reed flexes. If the reed is angled along its longitudinal axis, a portion of the rounded tip of the reed will still make contact with the probe and will not abrade the probe. Accordingly, a variety of tilting angles for the reed can be accommodated. These points just discussed also hold true for the reeds and probes of RF modules 600.

Referring now to RF module 500, the probes and the reeds each have a radius of curvature with the reeds having concave-arc shaped tips that have a radius of curvature which is slightly larger than the radius of curvature of the probes. Accordingly, the tip of a reed will not abrade a probe upon contact but will first rest upon a sloped surface of a probe and will then flex and wipe the surface of the probe as the contact force increases.

The contact regions of the contact members shown of the RF modules 200, 300, 400, 500, 600 and 600' also provide a predictable contact force and a controlled wiping action to remove the insulating molecular films as well as other particulate matter. Wiping involves a sliding motion of the reed contact region over the probe contact region that occurs during the actuation of the reed contact member towards the probe. Controlled wiping is facilitated by defining a start point and an end point for the wipe. The reeds shown for the RF module 500 are thinner and therefore more compliant to provide additional compliance to facilitate wiping. The reeds and probes for the remainder of the RF modules 200, 300, 400, 600 and 600' involve the motion of one contact region over another contact region from the start point to the end point in which both contact regions have cylindrically-shaped surfaces or one contact region has a cylindrically-shaped surface and the other has a flat surface. The start and end positions depend on the contact force, and the length, width, thickness and compliance of the reed.

The surfaces of the contact regions presented in the various embodiments discussed above are also easy to manufacture reliably since the various surfaces having a given radius of curvature are surfaces of revolution which can be easily manufactured. Furthermore, since the curvature of the contact regions is a macroscopic feature that is much larger than the a-spot dimensions, the behaviour of the various reed-probe contact region combinations shown above may perform similarly to one another. However, the embodiments, which provide for larger contact interface areas are more preferable because larger contact interface areas provide reduced contact resistance. Furthermore, rectangular or elliptical contact areas that have a large aspect ratio for the individual a-spots are preferred since this can reduce contact resistance by up to an order of magnitude in comparison to contact interfaces having a similar area but a circular shape.

The reed and probe contact regions described and illustrated herein are applicable to a wide frequency range. Modifications in the dimensions of the reed and probe contact regions as well as changes to the dimensions of the waveguide channels in the RF cavity of the microwave switch will facilitate operation in different frequency ranges. In particular, the reed and probe contact regions discussed herein are applicable to microwave switches operating from DC to Ku-band. Typical power levels vary from milliwatts to a thousand of watts. Different dimensions are also needed for the reed and probe contact regions for different power applications (different contact forces and different types of materials for the substrate and plating layers may also be used).

It should be understood that various modifications can be made to the preferred embodiments described and illustrated herein, without departing from the present invention, the scope of which is defined in the appended claims. As mentioned previously, the reed and probe contact regions described herein are applicable to a wide variety of microwave switches such as, but not limited to, SPDT, S-switches, C-switches, T-switches and R-switches as well as SPnT switches.

What is claimed is:

1. A switch contact for use in a microwave switch, said switch contact comprising:

a probe contact member having a first surface; and, a reed contact member having second surface, said second surface being non-conformal with respect to said first surface for providing an incomplete mechanical contact when said contact members are in contact, wherein, during contact, a contact stress distribution exists having a maximum stress value at a location within said contact members and at least one of said surfaces has a radius of curvature selected to adjust the location of the maximum stress value for reducing the magnitude of the contact stress distribution within said contact members.

2. The switch contact of claim 1, wherein each contact member has a plating layer overlying a metallic substrate, and said radius of curvature is selected to adjust said location of said maximum stress value to be within said metallic substrate of said contact members.

3. The switch contact of claim 1, wherein said radius of curvature is selected to adjust the location of the maximum stress value for reducing the magnitude of the contact stress distribution within the plating layer of the contact members.

4. The switch contact of claim 1, wherein said microwave switch comprises:

an RF module comprising a plurality of said probe contact members and a plurality of said reed contact members, each of said reed contact members having a transmitting state to electrically connect a pair of said probe contact members, and a non-transmitting state to electrically isolate said pair of probe contact members, thereby defining a switch configuration for said microwave switch;

an actuation module in communication with said RF module, said actuation module having an actuator for moving at least one of said reed contact members into a transmitting state and moving the remainder of said reed contact members into a non-transmitting state; and, a control module in communication with said actuation module for receiving command signals to control the switch configuration of said microwave switch by providing control signals to direct the operation of said actuation module.

5. The switch contact of claim 1, wherein said first surface has a first radius of curvature and said second surface has a second radius of curvature, wherein said radii of curvature are selected to adjust said location of said maximum stress value for reducing the magnitude of said contact stress distribution within said contact members.

6. The switch contact of claim 5, wherein said first radius of curvature is larger than said second radius of curvature.

7. The switch contact of claim 5, wherein said first radius of curvature is smaller than said second radius of curvature.

8. The switch contact of claim 5, wherein said radii of curvature are substantially similar.

9. The switch contact of claim 5, wherein said first surface has a toroidal shape having said first radius of curvature, and said second surface has a cylindrical shape having said second radius of curvature.

10. A switch contact for use in a microwave switch, said switch contact comprising: a probe contact member having a first surface with a toroidal shape; and, a reed contact member having a tip with a second surface, wherein, during contact, said first and second surfaces define a non-conformal contact having a contact interface located along a circular arc on a curved portion of said toroidal shape.

11. The switch contact of claim 10, wherein said second surface has a cylindrical shape.

12. A method of reducing a stress magnitude distribution in a switch contact for a microwave switch, said switch contact comprising a probe contact member having a first surface, and a reed contact member having a second surface, said method comprising:

selecting said first and second surfaces to be non-conformal for providing an incomplete mechanical contact, at least one of said surfaces having a radius of curvature;

calculating contact stress distributions within said contact members for several values of said radius of curvature; and, selecting a desired radius of curvature from said several values of said radius of curvature for reducing the magnitude of contact stress distribution within said contact members.

13. The method of claim 12, wherein step c includes selecting said radius of curvature for minimizing the magnitude of the contact stress distribution with said contact members.

14. The method of claim 12, wherein said contact members comprise a plating layer overlying a metallic substrate and step b includes applying a correction factor for calculating the stress distribution in said plating layer.

15. The method of claim 14, wherein said contact stress distribution has a maximum stress value at a location within said contact members and step c comprises selecting said radius of curvature for adjusting said location to be within said metallic substrate.

16. The method of claim 14, wherein step c comprises selecting said radius of curvature for reducing the magnitude of the contact stress distribution within the plating layer of the contact members.

17. The method of claim 12, wherein step a comprises providing a toroidal shape having said desired radius of curvature for said first surface.

18. The method of claim 12, wherein step a comprises providing a cylindrical shape having said desired radius of curvature for said second surface.

19. The method of claim 12, wherein step a includes providing a first radius of curvature for said first surface and a second radius of curvature for said second surface, step b includes calculating contact stress distributions within said contact members for several values of said first and second radii of curvature, and, step c includes selecting a first desired radius of curvature and a second desired radius of curvature from said several values of said first and second radii of curvature for reducing the contact stress distribution within said contact members.

20. The method of claim 19, wherein said method includes providing a toroidal shape having said first desired radius of curvature for said first surface and a cylindrical shape having said second desired radius of curvature for said second surface.

21. A switch contact for use in a microwave switch, said switch contact comprising: a probe contact member having a first surface with a toroidal shape; and, a reed contact member having a cylindrical shape, wherein, during contact, said first and second surfaces define a non-conformal contact.

22. A switch contact for use in a microwave switch, said switch contact comprising:

a probe contact member having a first surface; and, a reed contact member having a second surface having a radius of curvature, said second surface being non-conformal with respect to said first surface for providing an incomplete mechanical contact when said contact members are in contact.

23. The switch contact of claim 22, wherein said second surface has a cylindrical shape and said first surface has a toroidal shape.

* * * * *